(12) United States Patent
Koh et al.

(10) Patent No.: US 9,880,922 B1
(45) Date of Patent: Jan. 30, 2018

(54) SYSTEM AND METHOD FOR AUTOMATICALLY GENERATING A GRAPHICAL MODEL FROM A TEXT-BASED PROGRAM

(71) Applicant: The MathWorks, Inc., Natick, MA (US)

(72) Inventors: David Koh, Boston, MA (US); Brian K. Ogilvie, Holliston, MA (US); Zhongxin Li, Dover, MA (US); Shi Chao Zhang, Urbana, IL (US); Jihad E. Ibrahim, Ashland, MA (US)

(73) Assignee: The MathWorks, Inc., Natick, MA (US)

( * ) Notice: Subject to any disclaimer, the term of this patent is extended or adjusted under 35 U.S.C. 154(b) by 515 days.

(21) Appl. No.: 14/511,359

(22) Filed: Oct. 10, 2014

Related U.S. Application Data

(60) Division of application No. 12/722,168, filed on Mar. 11, 2010, now Pat. No. 8,983,823, which is a continuation-in-part of application No. 11/321,919, filed on Dec. 29, 2005, now Pat. No. 9,317,628.

(51) Int. Cl.
*G06F 9/45* (2006.01)
*G06F 11/36* (2006.01)
*G06F 9/445* (2006.01)
*G06F 17/50* (2006.01)

(52) U.S. Cl.
CPC ...... *G06F 11/3608* (2013.01); *G06F 9/44505* (2013.01); *G06F 11/3664* (2013.01); *G06F 17/5027* (2013.01)

(58) Field of Classification Search
CPC . G06F 9/4405; G06F 8/30; G06F 8/31; G06F 8/10; G06F 17/5027; G06F 9/4443; G06F 8/20

See application file for complete search history.

(56) References Cited

U.S. PATENT DOCUMENTS

| 5,819,071 A | 10/1998 | Mazer |
| 5,838,948 A | 11/1998 | Bunza |
| 5,857,091 A | 1/1999 | Fernandes et al. |
| 5,870,585 A | 2/1999 | Stapleton |
| 6,148,323 A | 11/2000 | Whitner et al. |
| 6,285,914 B1 | 9/2001 | Bae et al. |
| 6,385,765 B1 | 5/2002 | Cleaveland et al. |

(Continued)

OTHER PUBLICATIONS

Ahn, Taekyoon, et al., "Design verification by concurrent simulation and automatic comparison", 1997, Proceedings of the 40th Midwestern Circuits and Systems, pp. 1087-1090.

(Continued)

*Primary Examiner* — Kandasamy Thangavelu
(74) *Attorney, Agent, or Firm* — Cesari and McKenna, LLP; Michael R. Reinemann

(57) ABSTRACT

A system and method automatically generates graphical model from an object-oriented, textual program, and verifies the performance of the graphical model to the textual program. The textual program may include a plurality of system objects having properties. The objects may be mapped to graphical model blocks that have parameters. The properties of the system objects may be mapped to the parameters of the graphical model blocks.

26 Claims, 22 Drawing Sheets

(56) References Cited

U.S. PATENT DOCUMENTS

| | | | |
|---|---|---|---|
| 6,625,759 B1 | 9/2003 | Petsinger et al. | |
| 6,675,310 B1 | 1/2004 | Bloom et al. | |
| 6,728,913 B1 | 4/2004 | Parker | |
| 6,751,583 B1 | 6/2004 | Clarke et al. | |
| 6,922,819 B2 | 7/2005 | Visweswariah | |
| 6,922,821 B1 | 7/2005 | Nemecek | |
| 7,076,420 B1 | 7/2006 | Snyder et al. | |
| 7,100,195 B1* | 8/2006 | Underwood | G06F 9/4443 707/999.009 |
| 7,137,100 B2* | 11/2006 | Iborra | G06F 8/30 717/104 |
| 7,139,936 B2 | 11/2006 | Petsinger et al. | |
| 7,447,621 B1 | 11/2008 | Lam et al. | |
| 7,490,032 B1 | 2/2009 | Koh et al. | |
| 7,606,695 B1 | 10/2009 | Nouri et al. | |
| 7,827,510 B1* | 11/2010 | Schubert | G06F 17/5027 716/111 |
| 7,900,188 B2 | 3/2011 | Costa et al. | |
| 7,913,222 B2 | 3/2011 | Ogilvie et al. | |
| 8,234,623 B2 | 7/2012 | Orofino, II et al. | |
| 2003/0095141 A1* | 5/2003 | Shah | G06F 9/44505 715/735 |
| 2003/0135790 A1 | 7/2003 | Pignol | |
| 2004/0006722 A1 | 1/2004 | Safford | |
| 2004/0044990 A1 | 3/2004 | Schloegel et al. | |
| 2005/0210433 A1 | 9/2005 | Clarke et al. | |
| 2006/0225008 A1 | 10/2006 | Schleicher et al. | |
| 2007/0109903 A1 | 5/2007 | Motamedi | |
| 2007/0277151 A1* | 11/2007 | Brunel | G06F 8/31 717/113 |
| 2008/0092109 A1* | 4/2008 | Kinnucan, Jr. | G06F 8/10 717/105 |
| 2008/0098349 A1 | 4/2008 | Lin et al. | |
| 2010/0058289 A1* | 3/2010 | Hudson, III | G06F 8/20 717/105 |

OTHER PUBLICATIONS

Bhowmick, S. et al., "Faster PDE-based Simulations Using robust Composite Linear Solvers," 2004, Future Generation Computer Systems, vol. 20, pp. 373-387.
Boland, Jean-Francois et al., "Using Matlab and Simulink in a SystemC verification environment," Feb. 2005, Proceedings of the Design and Verification Conference DVCon05, 8 pages.
Brandmayr, G., et al., "Automatic co-verification of FPGA designs in Simulink", Jun. 8, 2005, Model-Based Design Conference 2005, ten unnumbered pages.
Burnard, Andrew, "Verifying and Validating Automatically Generated Code," International Automotive Conference, Jun. 2004, pp. 1-8.
Chang, Chen et al., "Rapid design and analysis of communication systems using the BEE hardware emulation environment," 2003, Proceedings of the 14th IEEE International Workshop on Rapid Systems Prototyping, seven pages.
"Communications Toolbox," 2002, The MathWorks, 409 pages.
Conrad, Mirko, et al., "Automatic evaluation of ECU software tests," Society of Automotive Engineers, Apr. 2005, pp. 1-10.
DiStefano, Joseph J., et al., "Schaum's Outline of Theory and Problems of Feedback and Control Systems," second edition, 1990, p. 157.
Dohm, N., et al., "Zen and the art of Alpha verification", 1998, Proceedings of the International Conference on VLSI in Computers and Processors, seven unnumbered pages.
Ekstrom, Per-Anders, "Eikos A Simulation toolbox for Sensitivity Analysis," Feb. 2005, Upsala Universtet, 57 pages.
Ghosh, Indradeep et al., "Design for verification at the register transfer level," 2002, Proceedings of the 15$^{th}$ International Conference on VLSI Design, pp. 1-6.

Hwang, James, et al., "System Level Tools for DSP in FPGAs", 2001, in Field-Programmable Logic and Applications, Springer-Verlag, pp. 534-543.
Johnson, Barry W., "Design and analysis of fault-tolerant digital systems", 1989, Addison-Wesley, pp. 169-200.
Johnson, William A., et al., "Mixed-level simulation from a hierarchical CHDL", 1980, ACM SIGDA Newsletter, vol. 10, Issue 1, pp. 2-10.
Krukowski, Artur, et al., "Simulink\Matlab-to-VHDL Route for full-custom/FPGA rapid prototyping of DSP algorithms", 1999, Matlab DSP Conference (Tampere, Finland), pp. 1-10.
Le-Huy, Hoang ,"Modeling and simulation of electrical drives using MATLAB/Simulink and Power System Blockset," 27$^{th}$ Annual Conference of the IEEE Industrial Electronics Society, 2001, pp. 1603-1611.
Mu, S., et al., "Mixed-signal modeling using Simulink based-C", Sep. 2005, Proceedings of the 2005 IEEE International Behavioral Modeling and Simulation Workshop, pp. 128-133.
Mulpur, Arun, "Use Co-Simulation for the Functional Verification of RTL Implementations," Mar. 2005, 7 pages.
Nickel, Ulrich, et al., "The FUJABA environment, " In Proceedings of the 22nd international conference on Software engineering (ICSE '00), ACM, New York, NY, USA, 2000, pp. 742-745.
Ownby, Matthew, et al., "A design methodology for implementing DSP with Xilinx System Generator for Matlab", 2003, Proceedings of the 35th Southeastern Symposium on System Theory, pp. 404-408.
PSpice User's Guide, 2000, Cadence Design Systems, 610 pages.
Puig-Medina, Marines, et al., "Verification of configurable processor cores", 2000, Proceedings of the 37th conference on design automation, pp. 426-431.
Richards, Brian, et al., "DSP system design using the BEE hardware emulation environment", Nov. 2003, Conference Record of Asilomar Conference on Signals, Systems, and Computers, pp. 895-899.
Rogers, Kurt D., "Acceleration and implementation of a DSP phase-based frequency estimation algorithm Matlab/Simulink to FPGA via Xilinx system generator," Binghamton University, 2001, pp. 1-173.
"Simulink: Model-Based and System-Based Design," Using Simulink: Version 5, The MathWorks, Inc., Jul. 2002, (see entire document, especially pp. 14-13 to 14-20).
Skormin, Victor A., "Application of the model reference approach in laser beam steering systems," Rome Laboratory, 1997, pp. 1-78.
Smith, Jon M., "Mathematical Modeling and Digital Simulation for Engineers and Scientists," second edition, 1987, John wiley & Sons, pp. 172 & 174.
Sosnowski, J., et al., "Pseudorandom versus deterministic testing of Intel 80x86 processors", 1996, Proceedings of the 22$^{nd}$ Euromicro conference, pp. 329-336.
Sturmer, Ingo, et al., "Overview of existing safeguarding techniques for automatically generated code," ACM SIGSOFT Software Engineering Notes, vol. 30, issue 4, Jul. 2005, pp. 1-6.
Taylor, S. et al., "Functional verification of a multiple-issue, out-of-order, superscalar Alpha processor—the DEC Alpha 21264 Microprocessor", 1998, Proceedings of the 1998 design Automation Conference, pp. 638-643.
U.S. Appl. No. 11/321,919, filed Dec. 29, 2005 by David Koh et al. for an Automatic Comparison and Performance Analysis Between Different Implementations, all pages.
Vanderplaats, "ADS—a fortran program for automated design synthesis," 1987, Engineering Design Optimization, Inc., pp. 1-57.
Wu, Zhongshan, "Simulation study and instability of adaptive control," Louisiana State University and Agricultural and Mechanical College, 2001, pp. 1-67.
"Xilinx System Generator v2.1 for Simulink", 2002, pp. 1-148.
Yim, Joonseo et al., "Design verification of complex microprocessors", 1996, IEEE Asia Pacific Conference on Circuits and Systems, pp. 441-448.

\* cited by examiner

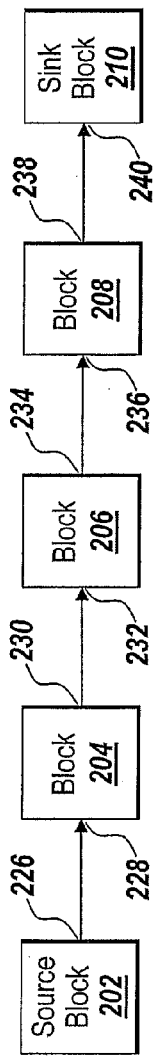
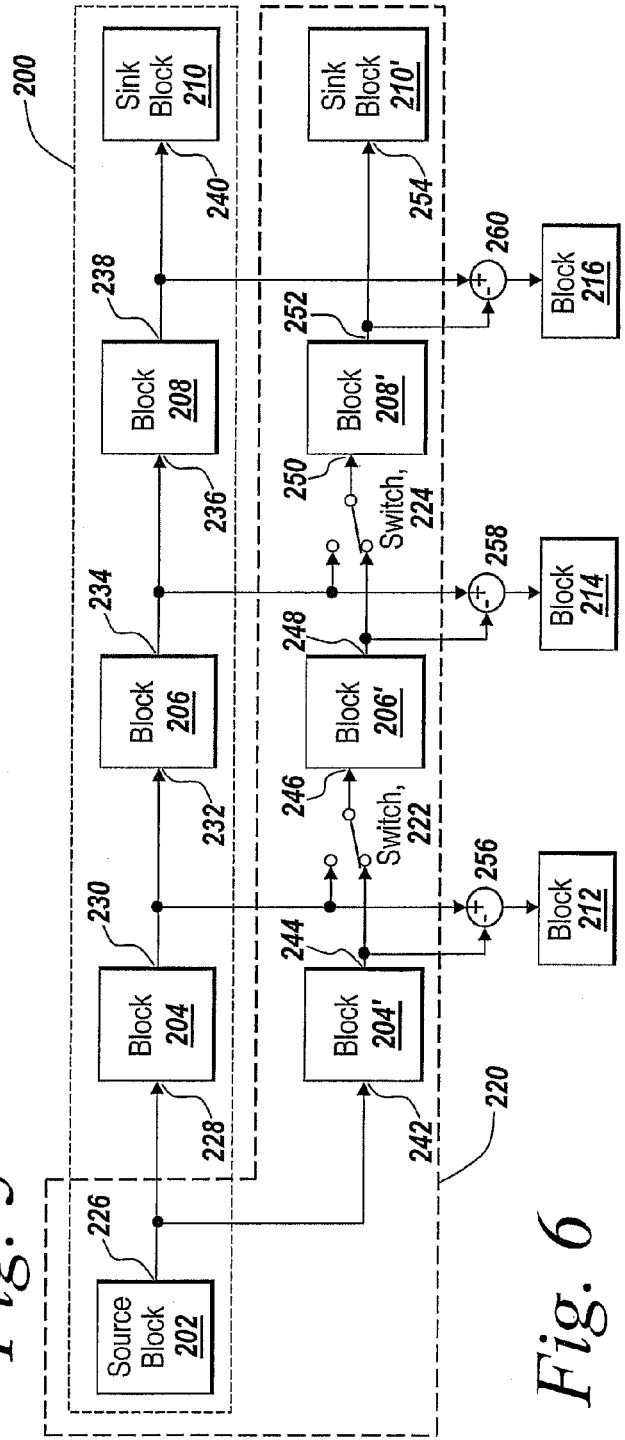
Fig. 5
Fig. 6

```
function props = getMap(this) ~ 1402                    ~ 1400 params = this.UserData; ~ 1404 props. Direction = params. Direction; ~ 1406 switch params.CountEvent
             case 'Rising edge'
                   props.CountEventInputPort = true; ~ 1412
                   props.CountEventCondition = 'Rising edge'; ~ 1414
             case 'Falling edge'
                   props.CountEventInputPort = true;
                   props.CountEventCondition = 'Falling edge';
             case 'Either edge'
                   props.CountEventInputPort = true;
                   props.CountEventCondition = 'Either Edge';
1410 {       case 'Non-zero sample
                   props.CountEventInputPort = true;
                   props.CountEventCondition = 'Non-Zero';
             case 'Free running'
                   props. CountEventInputPort = false; ~ 1416
                   props.SamplesPerFrame = params.SamplesPerFrame; ~ 1418
             otherwise
                   error('getcountercache:getMap:unsupportedEnum',...
                        'Unsupported enum value' '% s" for parameter' '% s ' '.',...
                        params.CountEvent, 'CountEvent');
       end props. InitialCount = params. InitialCount; ~ 1408 switch params.CounterSize
             case {'8 bits','16 bits','32 bits'}
                   props.CounterSize = params.CounterSize;
             case 'User defined'
                   props.CounterSize = 'Maximum';
1420 {       props.MaximumCount = params.MaxCount;
             otherwise
                   error('getcountercache:getMap:unsupportedEnum', ...
                        'Unsupported enum value' '%s" for parameter' '%s' '.', ...
                        params . CounterSi ze, 'CounterSi ze ') ;
       end
```

FIG. 14A

```
         ⎧  switch params.Output
         ⎪      case 'Count'
         ⎪          props.CountOutputDataType = params.CntDtype;
         ⎪          props.CountOutputPort= true;
         ⎪          props.HitOutputPort = false;
         ⎪      case 'Hit'
         ⎪          props.HitValues = params.HitValue;
         ⎪          props.CountOutputPort = false;
         ⎪          props.HitOutputPort = true;
  1422  ⎨      case 'Count and Hit'
         ⎪          props.HitValues = params.HitValue;
         ⎪          props.CountOutputDataType = params.CntDtype;
         ⎪          props.CountOutputPort= true;
         ⎪          props.HitOutputPort = true;
         ⎪      otherwise
         ⎪          error('getcountercache:getMap:unsupportedEnum', ...
         ⎪              'Unsupported enum value "%s" for parameter' '%s' '.', ...
         ⎪              params.OutputValue, 'OutputValue');
         ⎩  end ⎧  switch params.ResetInput
         ⎪      case
         ⎪      props.ResetInputPort = true;
         ⎪      case 0
  1424  ⎨      props.ResetInputPort = false;
         ⎪      otherwise
         ⎪          error('getcountercache:getMap:unsupportedEnum', ...
         ⎪              'Unsupported enum value "%s" for parameter' ' %s' '.', ...
         ⎪              params . Reset Input, 'Reset Input' ) ;
         ⎩  end
```

FIG. 14B

SYSTEM AND METHOD FOR AUTOMATICALLY GENERATING A GRAPHICAL MODEL FROM A TEXT-BASED PROGRAM

CROSS-REFERENCE TO RELATED APPLICATIONS

This application is a divisional of application Ser. No. 12/722,168, filed Mar. 11, 2010 for a Verification Harness for Automatically Generating a Text-Based Representation of a Graphical Model, which application is a continuation-in-part of application Ser. No. 11/321,919, filed Dec. 29, 2005, for Automatic Comparison and Performance Analysis Between Different Implementations, which applications are hereby incorporated by reference in their entireties.

BACKGROUND OF THE INVENTION

Field of the Invention

The present invention generally relates to technical computing, and, more particularly, to generating automatically an object-oriented, textual representation of a graphical model, and performing verification testing of the textual representation and the graphical model.

Background Information

Block diagrams are used to model real-world systems. Historically, engineers and scientists have utilized time-based block diagram models in numerous scientific areas, such as Feedback Control Theory and Signal Processing to study, design, debug, and refine dynamic systems. Dynamic systems, which are characterized by the fact that their behaviors change over time, are representative of many real-world systems. A dynamic system (either natural or man-made) is a system whose response at any given time is a function of its input stimuli, its current state, and the current time. Such systems range from simple to highly complex systems. Physical dynamic systems include, for example, a falling body, the rotating earth, biomechanical systems (muscles, joints, etc.), biochemical systems (gene expression, protein pathways), and weather and climate pattern systems. Examples of man-made or engineered dynamic systems include: a bouncing ball, a spring with a mass tied on an end, automobiles, airplanes, control systems in major appliances, communication networks, audio signal processing, nuclear reactors, and a stock market.

A block diagram model of a dynamic system is represented schematically as a collection of blocks interconnected by lines that represent signals. Each block represents an elemental dynamic system. A signal represents either the input or the output of a dynamic system. A line emanating at one block and terminating at another signifies that the output of the first block is an input to the second block. Each distinct input or output on a block is referred to as a "port". Signals correspond to the time-varying quantities represented by each line connection and are assumed to have values at each time instant at which the connecting blocks are enabled. The source block of a signal writes to the signal at a given time instant when its system equations are solved. The destination blocks of this signal read from the signal when their system equations are being solved.

It should be noted that the term "block diagram," as used herein, also refers to other graphical modeling formalisms. For instance, flow-charts are block diagrams of entities that are connected by relations. Flow-charts are used to capture process flow and are not generally suitable for describing dynamic system behavior. Data flow block diagrams are diagrams of entities with relations between them that describe a graphical programming paradigm where the availability of data is used to initiate the execution of blocks, where a block represents an operation and a line represents execution dependency describing the direction of data flowing between blocks. It will be appreciated that a block diagram model may include entities that are based on other modeling domains within the block diagram. A common characteristic among these various forms of block diagrams is that they define semantics on how to execute them.

In graphical modeling environments, such as model-based design tools, block diagram models can be created to represent a design, or algorithm, of an implementation for a computational hardware. One or more block diagram models may represent a design for a target hardware platform. A target hardware platform used in this application may include a single computing platform or multiple computing platforms. A target hardware platform may also have other elements such as memory, interfaces, or other integrated circuits (ICs). An automatic code generation application can automatically generate code and build programs from the block diagram model for implementation on the target hardware platform based on the design specified by the model. In this manner, the design of a block diagram model behaves as an implementation specification for automatic code generation. A graphical block diagram modeling environment can be used to produce designs and algorithms that can be implemented on a processor or computational IC, such as an FPGA or ASIC.

In conventional systems, users typically have no convenient way to verify that automatically generated code from a block diagram model will execute in an intended manner on a target platform, e.g., in a manner consistent with a design implemented in the block diagram model.

SUMMARY OF THE INVENTION

Briefly, the present invention in an embodiment is directed to a system and method for automatically generating an object-oriented, textual program from a graphical model, and for verifying the performance of the textual program as compared to the graphical model. The graphical model may have a plurality of executable, graphical blocks that are interconnected to define a function or procedure. Each block may have a plurality of parameters. A user may identify one or more target block types of the graphical model that is to be verified. The system interrogates the model and identifies each occurrence of the identified target block types, and obtains each block's parameters. The system maps each occurrence of the identified block types to a system object, and maps the block's parameters to properties of the system object. The system may include one or more predefined look-up tables (LUTs) for mapping executable, graphical blocks and their parameters to system objects and their properties. The system generates, for each occurrence of the target graphical block in the graphical model, an object-oriented, executable textual string. Each generated string includes at least one command to: instantiate a system object having functionality that matches the target graphical block; set one or more properties of the instantiated object based on the parameters of the respective block; and run the instantiated object. The generated strings may be loaded into embedded text blocks, which may be assembled into a verification model. The graphical model and the verification model may be simulated and the results produced by the two models compared in order to verify the objection of the system objects.

In another embodiment, the object-oriented, executable textual strings may be stored in a textual verification file. The file may be executed and the results produced during the execution of the file may be compared with the results produced by the graphical model.

BRIEF DESCRIPTION OF THE DRAWINGS

The invention description below refers to the accompanying drawings, of which:

FIG. 5 illustrates a block diagram model for a simulation that is suitable to practice with the present invention;

FIG. 6 illustrates a comparison between two implementations;

FIGS. 14A and 14B are partial views of a schematic illustration of a code snippet in accordance with an embodiment of the present invention;

DETAILED DESCRIPTION OF ILLUSTRATIVE EMBODIMENTS

Figure 1:
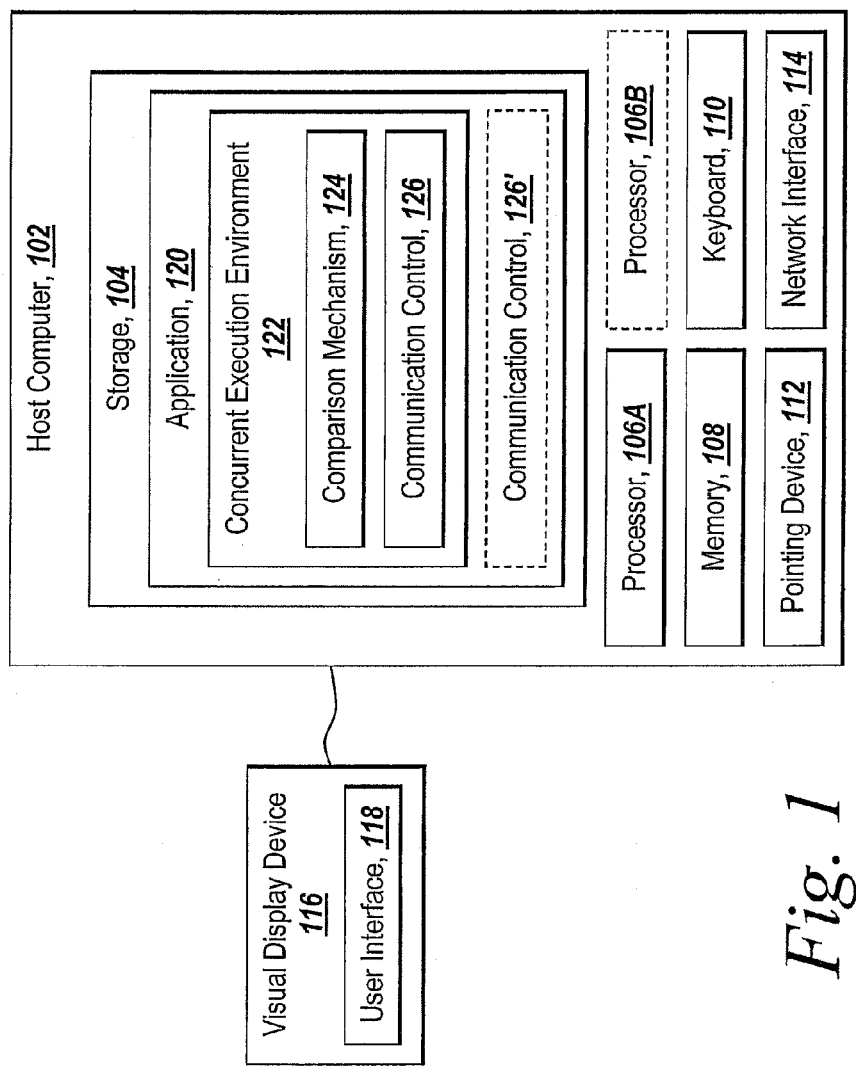
FIG. 1 is a block diagram of a computing device suitable for practicing an embodiment of the present invention.

For the purpose of discussion in this application, the following terms are given the following meaning in this application.

A processor includes, but not limited to, general purpose processor (GPP), microcontroller, graphics processor, multi-core processor and Digital Signal Processor (DSP).

A computational IC includes, but not limited to, FPGA, ASIC, programmable logic device (PLD), and programmable logic array (PLA).

A host computer is a computing device with a processor wherein the simulation environment, such as the Simulink® model-based design system, resides.

A computing platform is a processor, computational IC, an emulator of a processor, an emulator of a computational IC, a simulator of a processor, a simulator of a computational IC, or a combination thereof. An emulator or a simulator of a processor or a computation IC is a software emulation or software simulation that resides on a host computer.

The simulator allows execution of standalone code implementation, such as C code or HDL, intended for the processor or computation IC. Examples of a simulator includes, but not limited to, Trace32 from Lauderbach, C6000 DSP Simulator from Texas Instruments, and ModelSim HDL Simulator from Mentor Graphics.

A design is an algorithm for a hardware or software architecture, components, modules, interfaces to satisfy specified requirements.

A simulation is for execution on a computing device with a simulation environment such as the MATLAB® programming environment or the Simulink® model-based design system both from The MathWorks, Inc. of Natick, Mass.

A model executes within a simulation environment, such as the MATLAB® programming environment and the Simulink® model-based design system, on a host computer. A model can include, but not limited to, application design that can be executed in simulation, application design from which code can be automatically generated, communications interface with ail external computing platform.

A block diagram model is a graphical representation of a model using block diagrams. A single block diagram may represent a design for one or more computing platforms. On the other hand, one or more block diagram models may represent a design for a single computing platform.

A standalone code implementation is a standalone software that can be executed on a host computer or a computing platform.

An implementation is the realization of the intended design in simulation or a standalone code implementation. Examples of an implementation include, but not limited to, a simulation of a design on a host computer, and execution of a standalone code implementation on a computing platform. One or more models can also be used to represent one implementation.

A subsystem is a hierarchical model abstraction that can include multiple blocks and other subsystems.

A parameter is a variable defined by an algorithm. For example, given a function y=K*u, where y is the output and u is the input, K is a parameter of the function that can be varied by a user manually or programmatically to determine what the function will be.

An intermediate output is an intermediate result of a simulation or execution of a standalone code implementation. For example, in a graphical block diagram modeling application, an intermediate output can be an output (or output signal) of a block within a block diagram model. In another example, in the execution of a standalone code implementation, an intermediate output can be an output of a function or execution results of a sequence of instructions.

The present invention provides a method and system for comparing different implementations of one or more designs. An illustrative embodiment of the present invention provides a method and system for automatic verification of automatically generated standalone code implementation intended for execution on a target computing platform against its original simulation design from which the standalone code is generated. A user can use this verification to double check if the automatically generated code performs as predicted in the original simulation design. The illustrative embodiment relieves the user's burden to write manual code to communicate with the target computing platform and administer manual tests.

The present invention provides a method and system for comparing simultaneous executions of different implementations. A block, a collection of blocks, a subsystem, a model, or a collection of integrated models can be used to represent an implementation. Comparison of different implementations can be done at different levels. Comparison of only the final execution results of the different implementations is not always helpful as different components of the implementations can affect the final execution results. Hence, one advantage of the present invention is that a user can choose to compare intermediate outputs and choose how errors between the different implementations should be propagated, such as if an error at an earlier stage should be allowed to propagate to a later stage in the execution.

The present invention also provides a method and system for comparing simultaneous executions of standalone code implementations on the same or different computing platforms. A host computer can communicate with the one or more computing platforms that execute the standalone code implementations and instruct the computing platforms to execute the standalone code implementations simultaneously in a locked-step manner. A user can compare how one standalone code implementation performs on two different computing platforms, or how two different standalone code implementations perform on the same platform.

For example, when the computing platforms are external to the host computer, the present invention allows an application program on the host computer to communicate with the external computing platforms and instruct the simultaneous execution of the standalone code implementations and further retrieve and compare the executions results on the host computer. A user does not need to analyze data after execution of the standalone code implementations. The present invention may allow real-time analysis and comparison of two executions of standalone code implementations. One of ordinary skill in the art will appreciate there are many combinations and modifications one can make with the exemplary embodiments described herein but still does not depart from the spirit and scope of the present invention.

In a preferred embodiment of the present invention, a block diagram can be used to represent a comparison model that compares two implementations, such as two simulations, two standalone code implementations, or one simulation and one standalone code implementation. The comparison can be done at a block level, a subsystem level, a model level, or multi-model level. The present invention may allow automatic comparison once a user identifies the intermediate outputs and/or signals that the user wants to compare and monitor. Reports can be generated to show the statistics of the comparison results.

Illustrative embodiments will be described below for illustrative purposes relative to the technical computing environment of the MATLAB® programming environment and the Simulink® model-based design system from The MathWorks, Inc. of Natick, Mass. Although the illustrative embodiments are described relative to a Math Works-based application, one of ordinary skill in the art will appreciate that the present invention may be applied to other graphical modeling environments and technical computing environments, such as any technical computing environments using software products of Rhapsody from I-Logix Inc., TargetLink and Real-Time Interface from dSPACE GmbH, RT-LAB™ from Opal-RT Technologies, Inc., EXITE from EXTESSY AG, LabVIEW and MATRIXx from National Instruments, Inc., SystemVue™ from Eagleware-Elanix Corporation, Mathematica® from Wolfram Research, Inc., Mathcad of Mathsoft Engineering & Education Inc., COSSAP from Synopsys, Inc., HyperSignal® from Hyperception, Inc., Dymola from Dynasim AB, or Maple™ from Maplesoft, a division of Waterloo Maple Inc. Furthermore, one ordinarily skilled in the art will appreciate that the present invention may apply to any graphical modeling environment, such as one providing modeling with a Unified Modeling Language (UML), Hardware Description Language (HDL), or that provides a physics modeling domain. Additionally, those skilled in the art will also appreciate that the principles and concepts are equally applicable to non-graphical modeling applications as well.

FIG. 1 depicts an environment suitable for practicing an illustrative embodiment of the present invention. The environment includes a host computer 102 having memory 108, on which software according to one embodiment of the present invention may be stored in a tangible computer-readable medium, processor 106A, and optionally processor 106B, for executing software stored in the memory 108, and other programs for controlling system hardware. Each of the processors 106A and 106B can be a single or multiple core processor. Virtualization can be employed in host computer 102 so that infrastructure and resources in the computing device can be shared dynamically. Virtualized processors may also be used with application 120 and other software in storage 104. A virtual machine can be provided to handle a process running on multiple processors so that the process appears to be using only one computing resource rather than multiple. Multiple virtual machines can also be used with one processor. Other computing resources, such as FPGA, ASIC, DSP, and GPP, may also be used for executing code and/or software. A hardware accelerator can additionally be used to speed up the general processing rate of the host computer 102.

The memory 108 may comprise a computer system memory or random access memory such as DRAM, SRAM, EDO RAM, etc. The memory 108 may comprise other types of memory as well, or combinations thereof. A user may interact with the host computer 102 through a visual display device 116 such as a computer monitor, which may include a user interface 118. The host computer 102 may include other I/O devices such a keyboard 110 and a pointing device 112, for example a mouse, for receiving input from a user. Optionally, the keyboard 110 and the pointing device 112 may be connected to the visual display device 116. The host computer 102 may include other suitable conventional I/O peripherals. The host computer 102 may further comprise a storage device 104, such as a hard-drive or CD-ROM, for storing an operating system and other related software, and for storing application 120, such as the Simulink® model-based design system. Application 120 may include a concurrent execution environment 122 to enable concurrent execution and/or monitoring of simulations and/or standalone code implementations on the host computer 102. Concurrent execution environment 122 includes comparison mechanism 124 and communication control 126 (discussed later). Those skilled in the art will appreciate that communication control 126 is adaptable to be included as part of the application 120 or a stand alone application that responds to calls from the application 120, such as communication control 126'. Additionally, the application 120 can be run from a bootable CD, such as, for example, KNOPPIX®, a bootable CD for GNU/Linux.

Additionally, the host computer 102 may include a network interface 114 to interface to a Local Area Network (LAN), Wide Area Network (WAN) or the Internet through a variety of connections including, but not limited to, standard telephone lines, LAN or WAN links (e.g., 802.11, T1, T3, 56 kb, X.25), broadband connections (e.g., ISDN, Frame Relay, ATM), wireless connections, or some combination of any or all of the above. The network interface 114 may comprise a built-in network adapter, network interface card, PCMCIA network card, card bus network adapter, wireless network adapter, USB network adapter, modem or any other device suitable for interfacing the host computer 102 to any type of network capable of communication and performing the operations described herein. Moreover, the host computer 102 may be any computer system such as a workstation, desktop computer, server, laptop, handheld computer or other form of computing or telecommunications device that is capable of communication and that has sufficient processor power and memory capacity to perform the operations described herein.

The host computer 102 can be running any operating system such as any of the versions of the Microsoft® Windows® operating systems, the different releases of the Unix and Linux operating systems, any version of the MacOS® for Macintosh computers, any embedded operating system, any real-time operating system, any open source operating system, any proprietary operating system, any operating systems for mobile computing devices, or any other operating system capable of running on the computing device and performing the operations described herein.

Figure 2:
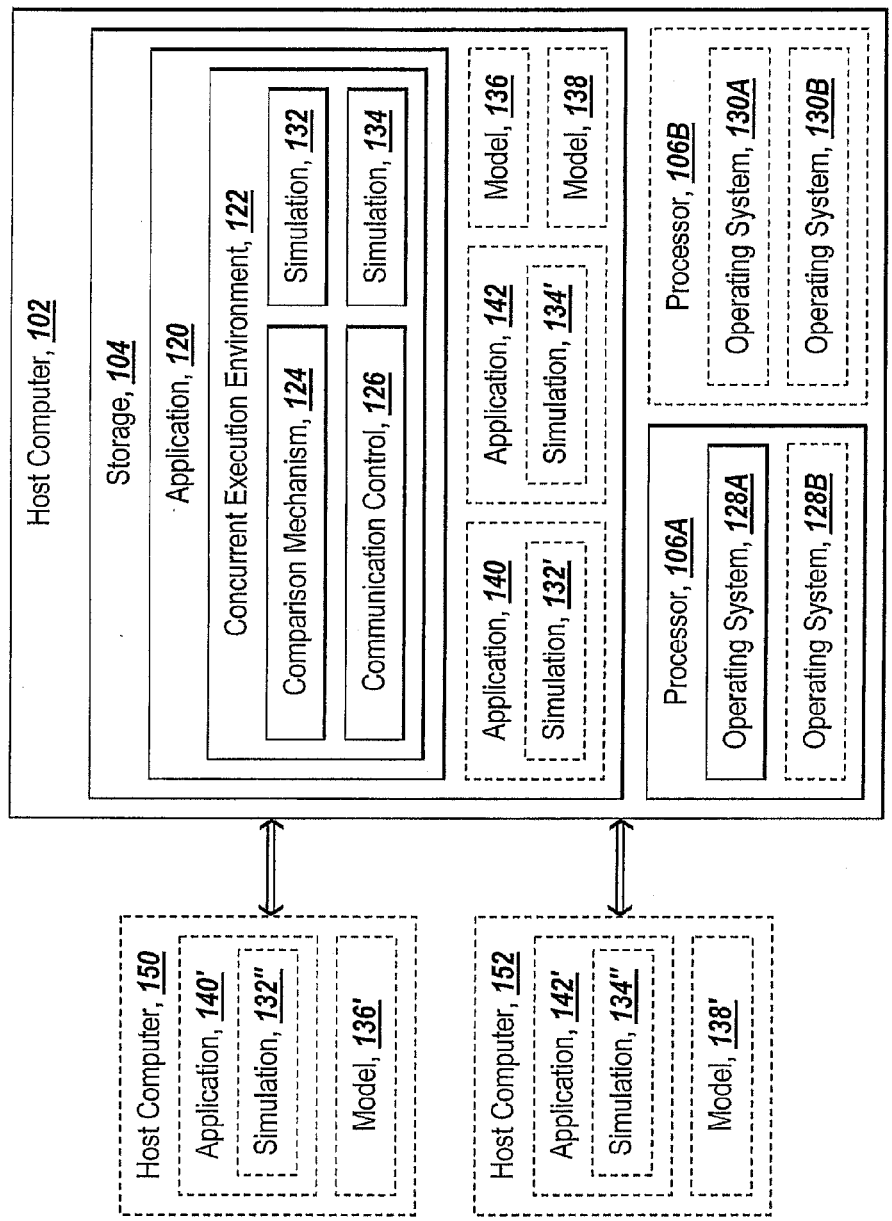
FIG. 2 illustrates a suitable system for practicing one embodiment of the present invention.

FIG. 2 depicts a suitable system for practicing one embodiment of the present invention. In one embodiment of the present invention, simulation 132 and simulation 134 are monitored and executed in the concurrent execution environment 122. Both simulation 132 and simulation 134 can run on processor 106A. Alternatively, simulation 132 can run on processor 106A and simulation 134 can run on processor 106B. Processor 106A can have operating system 128A and optionally operating system 128B. Processor 106B can have operating system BOA and optionally operating system 130B. Alternatively, both processor 106A and processor 106B share one operating system. Comparison mechanism 124 is capable of comparing simulation 132 and simulation 134 during execution of simulation 132 and simulation 134. In one aspect of the present invention, semantics of simulation 132 and simulation 134 can be described using model 136 and model 138, respectively. In a preferred embodiment of the present invention, model 136 and model 138 are block diagram models built by a block diagram modeling application, such as the Simulink® model-based design system. Hence, comparison mechanism 124 can compare simulation 132 and simulation 134 at a variety of different levels. For example, comparison mechanism 124 can compare an intermediate output or a block signal from model 136 with another intermediate output or block signal from model 138. Additionally, comparison mechanism 124 can compare output of a subsystem from model 136 with another subsystem from model 138. Furthermore, comparison mechanism 124 can compare a final output of the model 136 with a final output of the model 138. Model 136 and model 138 can also contain other smaller models. Additionally, comparison mechanism 124 can automatically generate a comparison model to compare the simulations 132 and 134. The comparison model may be implemented as a block diagram model, where one or more blocks are used to represent semantics of the simulation 132 and 134. In one embodiment of the present invention, model 136 and 138 are a submodel or subsystem of the comparison model.

In another embodiment of the present invention, comparison mechanism 124 can compare simulation 132 with simulation 132' that is executed by application 140. Application 140 can execute on the same or different processor that executes application 120. Application 120 can also be controlled by the same or different operating system as the one that controls application 120. Communication control 126 is capable of communicating between application 120 and application 140. Communication control 126 is also capable of controlling execution of simulation 132'. In other words, communication control 126 can determine when to execute, pause, or terminate the simulation 132'. Communication control 126 can also determine what inputs simulation 132' should use for execution. Communication control 126 can further determine if a portion or all of simulation 132' should be executed. Communication control 126 can issue instructions to cause simultaneous execution of simulation 132 and simulation 132' in a locked-step manner. Comparison mechanism 124 can automatically generate a comparison model to compare the simulation 132 with simulation 132'. The comparison model may be implemented as a block diagram model, where one or more blocks are used to represent semantics of the simulation 132 and 132'.

In a further embodiment of the present invention, comparison mechanism 124 can compare execute results of simulation 132' executing by application 140 and simulation 134' executing by application 142. Application 140 and application 142 can execute on the same or different processor and be controlled by the same or different operating system. Communication control 126 communicates with application 140 and application 142 regarding data related to simulation 132' and simulation 134' respectively. Communication control 126 can issue instructions to cause simultaneous execution of simulation 132' and simulation 134' in a locked step manner.

Semantics of simulation 132' and simulation 134' can be represented by model 136 and model 138 respectively. In a preferred embodiment of the present invention, model 136 and model 138 are built using a block diagram modeling application, such as the Simulink® model-based design system. Application 120 uses model 136 and model 138 in the concurrent execution environment to represent simulation 132' and simulation 134', respectively. Comparison mechanism 124 can request communication control 126 to obtain data from simulation 132' and/or simulation 134' for comparison purposes. Communication control 126 can make a function call to a specific portion of simulation 132' or simulation 134'. Comparison mechanism 124 can automatically generate a comparison model to compare the simulation 132' and simulation 134'. The comparison model may be implemented as a block diagram model, where one or more blocks are used to represent semantics of the simulation 134' and 132'.

In another aspect of the present invention, comparison mechanism 124 can compare simulation 132 or simulation 132' with simulation 132" that executes on application 140' which resides on host computer 150. Communication control 126 communicate between application 120 on host computer 102 and application 140' on computing device regarding data related to simulation 132". Application 120 can use a model in concurrent execution environment 122 to represent semantics of simulation 132". The model can be stored locally in storage 104 or externally at computing 150, such as model 136'. Comparison mechanism 124 can make a function call to a specific portion of simulation 132". Communication control 126 is also capable of controlling execution of simulation 132". In other words, communication control 126 can determine when to execute, pause, or terminate the simulation 132". Communication control 126 can also determine what inputs simulation 132" should use for execution. Communication control 126 can further determine if a portion or all of simulation 132" should be executed. Communication control 126 can issue instructions to cause simulation 132" and simulation 132 or simulation 132' to execute simultaneously in a locked-step manner. Comparison mechanism 124 can automatically generate a comparison model to compare the simulation 132" and simulation 132 or simulation 132'. The comparison model may be implemented as a block diagram model, where one or more blocks are used to represent semantics of the simulation 132" and simulation 132' or simulation 132.

In a further embodiment of the present invention, comparison mechanism 124 can compare execution of simulation 132" with execution of simulation 134". Simulation 134" can be executed by an application 142' on a host computer 152 that is different from host computer 150. Host computer 152 can also include a model 138' that application 120 uses to represent the semantics of simulation 134". Communication control 126 can issue instructions to cause simultaneous execution of simulation 132" and simulation 134" in a locked step manner. Comparison mechanism 124 can automatically generate a comparison model to compare the simulation 132" and simulation 134". The comparison model may be implemented as a block diagram model, where one or more blocks are used to represent semantics of the simulation 134" and 132".

One of ordinary skill in the art will appreciate that any type of simulation may be used in the present invention. Additionally, applications 120, 140, and 140' may be different applications, different instances of the same application, or a combination thereof.

Figure 3:
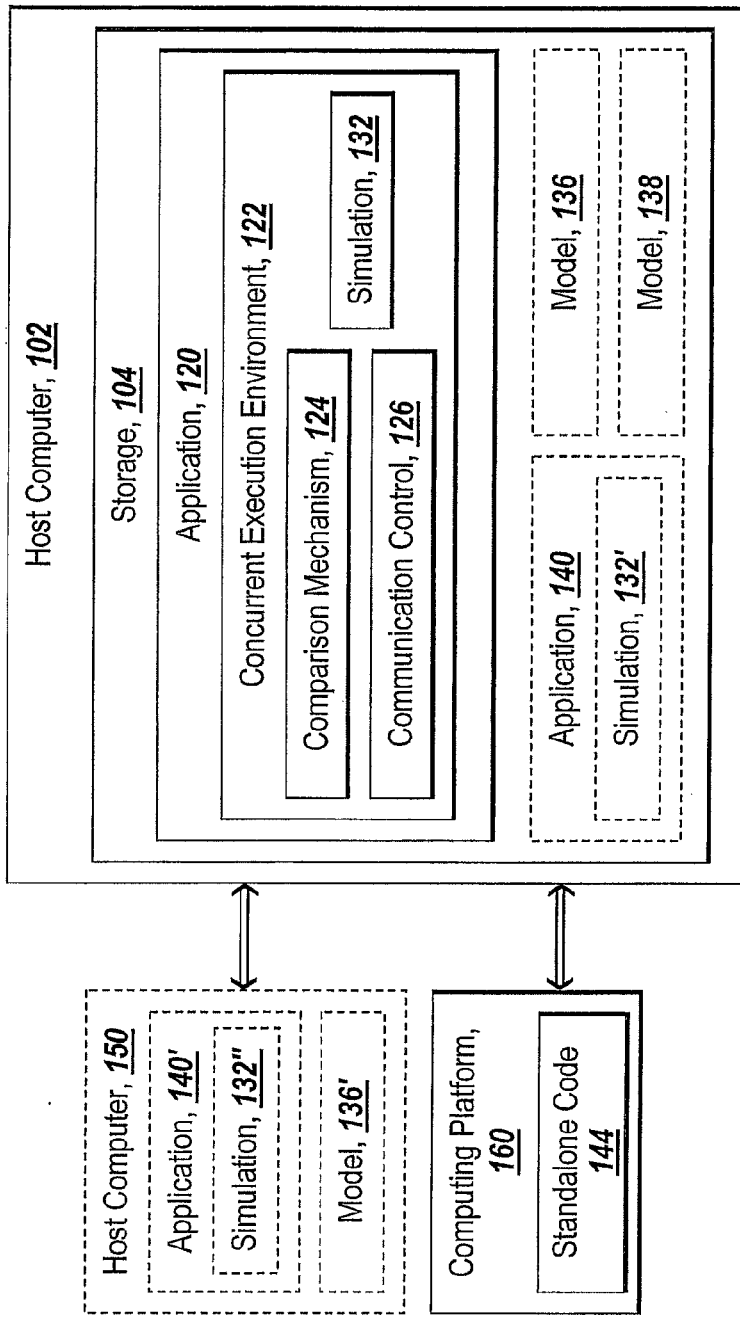
FIG. 3 illustrates a suitable system for practicing another embodiment of the present invention.

FIG. 3 depicts a suitable system for practicing another embodiment of the present invention. In this embodiment of the present invention, comparison mechanism 124 can compare execution results of simulation 132 executing on a host computer 102 with standalone code implementation 144 executing on a computing platform 160. Standalone code implementation 144 can be implemented in any programming language, such as C and Hardware Description Language (HDL). Communication control 126 can communicate between computing platform 160 and application 120 for data regarding standalone code implementation 144. Communication control 126 can issue instructions to cause simultaneous execution of simulation 132 and standalone code implementation 144 in a locked-step manner so that comparison mechanism 124 can make comparison during execution of simulation 132 and standalone code implementation 144. In one aspect of the present invention, application 120 uses model 136 to represent simulation 132 and model 138 to represent standalone code implementation 144. Model 136 and model 138 may be built using a block diagram modeling application, such as the Simulink® model-based design system. Communication control 126 can make a function call to standalone code implementation 144 via a block in model 138. Communication control 126 is also capable of controlling execution of standalone code implementation 144. In other words, communication control 126 can determine when to execute, pause, or terminate the execution of the standalone code implementation 144. Communication control 126 can also determine what inputs standalone code implementation 144 should use for execution. Communication control 126 can further determine if a portion or all of the standalone code implementation 144 should be executed. In a preferred embodiment of the present invention, a comparison model is automatically generated by comparison mechanism 124 to compare the simulation 132 and standalone code implementation 144. The comparison model may be implemented as a block diagram model, where one or more blocks are used to represent semantics of the simulation 132 and standalone code implementation 144.

In one aspect of the present invention, model 136 represents a design being simulated by simulation 132 and standalone code implementation 144 is automatically generated from the same design using specification information of computing platform 160, such as memory information, interface information, processing speed information of the computing platform 160. In this case, model 138 is used to represent the physical execution of standalone code implementation 144 on the computing platform 160, whereas model 136 represents a simulation of the design in a simulation environment, such as one provided by the Simulink® model-based design system. In one embodiment of the present invention, application 120 can automatically generate model 138. Application 120 or comparison mechanism 124 can automatically generate a comparison model to help illustrate the verification of the automatically generated standalone code implementation 144 against the design as simulated by simulation 132. Hence, the present invention provides an automatic method to verify the generated standalone code implementation 144 with the original design. The present invention also allows a user to specify how one wants to verify the automatically generated code with its original design (details later). One of ordinary skill in the art can appreciate that a user would generally like to know if the automatically generated standalone code implementation from the design behaves as predicted in the simulation simulating the design. Additionally, one of ordinary skill in the art will also appreciate that there is some discrepancy between the automatically generated code and the simulation due to many factors, such as design choices and quality of the automatically generated standalone code implementation, that a user would generally like to be able to compare the execution of the automatically generated standalone code implementation with the simulation to see how different the execution results are.

In a preferred embodiment of the present invention, model 138 is built using gateway blocks described in U.S. patent application Ser. No. 11/028,172, the content of which is incorporated herein by reference. In another embodiment of the present invention, the functionalities of the gateway block can be achieved by using the processor-in-the-loop (PIL) technology featured in Embedded Target for Motorola MPC555 from The MathWorks, Inc. of Natick, Mass. or TargetLink from dSPACE of Germany. One of ordinary skill in the art will appreciate that there are many different ways and technologies that can be used to achieve the purpose of a gateway block.

A gateway block can provide input to the standalone code implementation on the computing platform 160 and wait for the computing platform 160 to execute a portion of the standalone code implementation that is represented by the gateway block. Once the gateway block receives the output from the execution of the portion of the standalone code implementation that is represented by the gateway block, the gateway block can provide the received output as an input to another block in the block diagram model. The gateway block can carry out the above processing by using many different technologies, such as via APIs to the computing platform's debugger or IDE of the computing platform, and via direct interface device drivers to the computing platform (Universal Serial Bus (USB), Joint Test Action Group (JTAG), TCP/IP, RS-232). Additionally, a gateway block does not need to be a visible block in a block diagram model because the purpose of the use of the gateway block is to communicate with a computing platform external to the host computer.

When the standalone code implementation is implemented in HDL, model 138 can be automatically created using one or more gateway blocks or co-simulation blocks, such as ones from The MathWorks' product EDA Simulator Link, to communicate with a computing platform executing standalone HDL code implementation.

In another embodiment of the present invention, comparison mechanism 124 can compare simulation 132' executing by application 140 with standalone code implementation 144 embedded on a computing platform 160. Communication control 126 can communicate with application 140 regarding data related to simulation 132' and also communicate with computing platform 160 regarding data related to standalone code implementation 144. Communication control 126 can issue instructions to cause simultaneous execution of simulation 132' and standalone code implementation 144 in a locked-step manner so that comparison mechanism 124 can make comparison during execution of simulation 132' and standalone code implementation 144. Comparison mechanism 124 can automatically generate a comparison model to compare the simulation 132' and standalone code implementation 144. The comparison model may be implemented as a block diagram model, where one or more blocks are used to represent semantics of the simulation 132' and standalone code implementation 144.

In still another embodiment of the present invention, comparison mechanism 124 can compare simulation 132" executing on host computer 150 with standalone code implementation 144 embedded on a target platform. Communication control can communicate with application 140' regarding simulation 132" and communicate with computing platform 160 regarding standalone code implementation 144. Communication control 126 can issue instructions to cause simultaneous execution of simulation 132" and standalone code implementation 144 in a locked-step manner so that comparison mechanism 124 can make comparison during execution of simulation 132" and standalone code implementation 144. Comparison mechanism 124 can automatically generate a comparison model to compare the simulation 132" and standalone code implementation 144. The comparison model may be implemented as a block diagram model, where one or more blocks are used to represent semantics of the simulation 132" and standalone code implementation 144.

One of ordinary skill in the art will appreciate that although the illustrated example only show the standalone code implementation 144 being executing on a computing platform external to the host computer 102, the present invention can be equally applied to standalone code implementations executed on a computing platform internal to the host computer 102.

Figure 4:
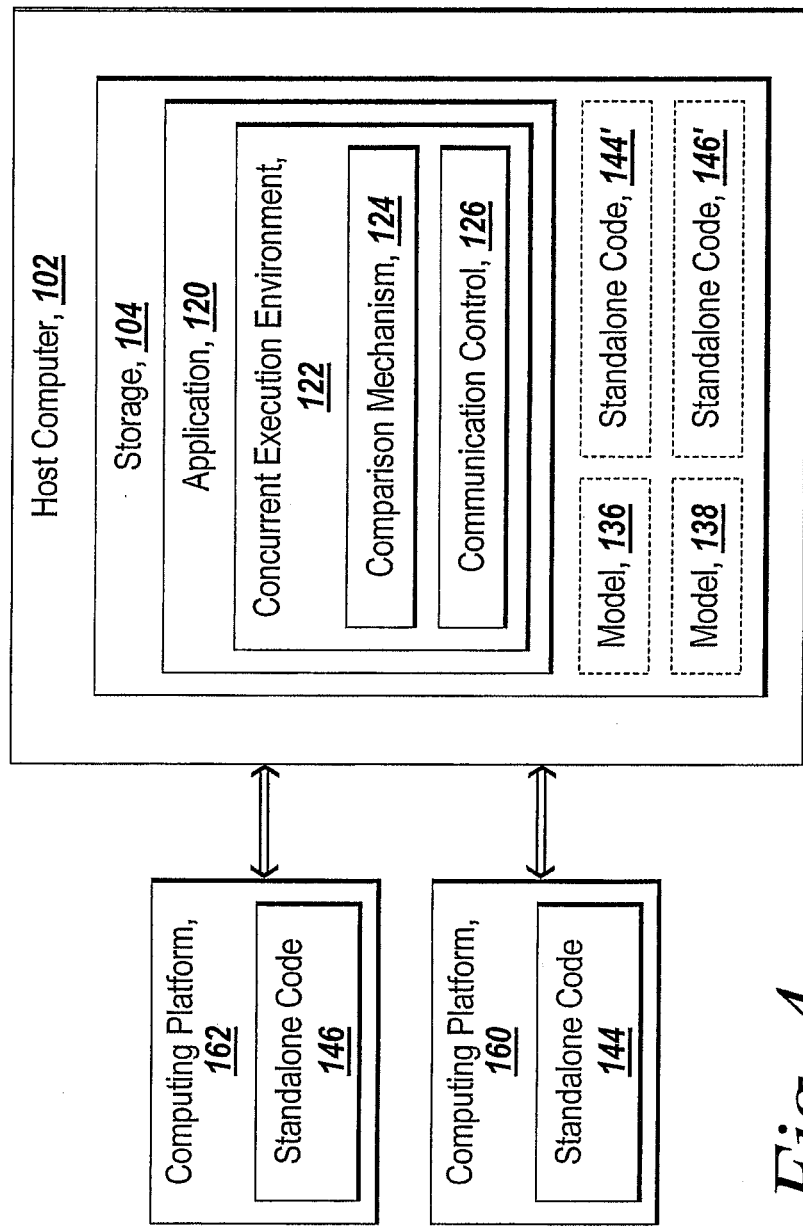
FIG. 4 illustrates a suitable system for practicing a further embodiment of the present invention.

FIG. 4 depicts an exemplary system that is suitable for practicing one embodiment of the present invention. Comparison mechanism 124 can compare standalone code implementation 144 and standalone code implementation 146 executed on computing platform 160 and computing platform 162, respectively. Standalone code implementations 144 and 146 can be implemented in any programming language, such as C and HDL. Communication control 126 can communicate with computing platform 162 regarding information for standalone code implementation 146. Communication control can also communicate with computing platform 160 regarding information for standalone code implementation 144. Communication control can issue instructions to cause simultaneous execution of standalone code implementation 144 and standalone code implementation 146 in a locked-step manner so that comparison mechanism 124 can make comparison during execution of standalone code implementation 144 and 146. In one embodiment of the present invention, application 120 uses model 136 to represent execution of standalone code implementation 144 on computing platform 160 and model 138 to present execution of standalone code implementation 146 on computing platform 162. In a preferred embodiment of the present invention model 136 and model 138 are built using a block diagram modeling application, such as the Simulink® model-based design system. Comparison mechanism 124 can automatically generate a comparison model to compare the standalone code implementation 146 and standalone code implementation 144. The comparison model may be implemented as a block diagram model, where one or more blocks are used to represent semantics of the standalone code implementations 144 and 146. Hence, the user can visualize the comparison of specific intermediate outputs and signals in the comparison model.

In another embodiment of the present invention, comparison mechanism 124 can compare standalone code implementation 144 executed on computing platform 160 with standalone code implementation 144' executed on host computer 102. Communication control 126 can issue instructions to cause simultaneous execution of standalone code implementation 144' and standalone code implementation 144 in a locked step manner so that comparison mechanism 124 can make comparison during execution of the standalone code implementation 144 and standalone code implementation 144'. Models can be used to represent the execution of the standalone code implementation under a certain environment. Comparison mechanism 124 can automatically generate a comparison model to compare the standalone code implementation 144' and standalone code implementation 144. The comparison model may be implemented as a block diagram model, where one or more blocks are used to represent semantics of the standalone code implementations 144 and 144'.

In a further embodiment of the present invention, comparison mechanism 124 can compare execution results of standalone code implementation 144' and standalone code implementation 146'. Standalone code implementation 144' and standalone code implementation 146' mayor may not be executed by the same processor or controlled by the same operating system. Communication control 126 can also issue instructions to cause simultaneous execution of the standalone code implementations 144' and 146' in a locked step manner so that comparison mechanism can make comparison during execution of the standalone code implementations 144' and 146'. Comparison mechanism 124 can automatically generate a comparison model to compare the standalone code implementation 146' and standalone code implementation 144'. The comparison model may be implemented as a block diagram model, where one or more blocks are used to represent semantics of the standalone code implementations 144' and 146'.

Once a user provides comparison instructions, comparison mechanism 124 can compare execution of two different standalone code implementations on the same type of computing platforms. In another embodiment of the present invention, comparison mechanism 124 can obtain comparison instructions from a specific location in the storage. Comparison mechanism 124 can also compare execution of the same standalone code implementations on different types of computing platforms. The present invention also allows comparison mechanism 124 to compare execution of different standalone code implementations on different types of computing platforms. Furthermore, the present invention can also compare execution of one standalone code implementation on an external computing platform with another standalone code implementation on an internal computing platform on the host computer. Additionally, the present invention also enables comparison of execution of two standalone code implementations on the same computing device.

FIG. 5 and FIG. 6 provide an exemplary implementation of the present invention as depicted in FIG. 3. FIG. 5 illustrates a block diagram model representing an implementation 200 of a design implemented using a block diagram modeling application, such as the Simulink® model-based design system. Block 202 is a source block that provides input signals to the entire implementation 200. Block 202 has an output port 226 where a signal exits block 202 and enters block 204 via input port 228. Block 204 has an output port 230 where a signal exits block 204 and enters block 206 via input port 232. Signals from block 206 exit from output port 234 and feed into block 208 via input port 236. Block 208 has output port 238 where a signal exits and enters block 210 via input port 240. Block 210 is a sink block having no output ports. Implementation 200 can be stored in storage 104 and executed on the host computer 102. Outputs from blocks 204, 206, and 108 are considered as intermediate outputs of implementation 200. One of ordinary skill in the art will appreciate that implementation 200 can have any number of blocks and the blocks does not need to be in series. Blocks 228, 234, and 238 can be, but not limited to, a filter block, a transform block, a custom block, a subsystem, or other types of blocks provided by the Simulink® model-based design system.

FIG. 6 illustrates a comparison/verification model that compares implementation 200 with implementation 220. Implementation 200 includes exactly the same blocks as the block diagram model shown in FIG. 5. Implementation 220 can be the execution of standalone code implementation 144 on the computing platform 160. One of ordinary skill in the art will appreciate that model implementation 220 can also be the execution of several standalone code implementations on the same or different computing platforms. Implementation 220 is represented using one or more blocks in the comparison/verification model. The comparison/verification model can be stored in storage 104. Communication control 126 can pass instructions from the host computer 102 to computing platform 160 to execute standalone code implementation 144 in a certain way and retrieves execution results of the standalone code implementation 144 from the computing platform 160 and communicate the execution results back to host computer 102. Implementation 220 uses the same source block 202 as implementation 200 so that both implementations use the same input signals. Alternatively, a user can choose to use different input signals for implementation 200 and implementation 220. Additionally, input signals may also be generated using one or more external input devices.

Implementation 220 includes block 204' that receives input signals from block 202 via input port 242 and outputs signals to output port 244. Block 204' can represent execution of a portion of standalone code implementation 144 on the computing platform 160. Furthermore, block 204' can represent execution of a function of the standalone code implementation 144 on the computing platform 160. Communication control 126 can make a function call via block 204' to computing platform 160. For example, block 204' can be a gateway block that is described in the U.S. patent application Ser. No. 11/028,172, which is incorporated herein by reference in its entirety. Alternatively, real-time data transfer such as Texas Instruments Real-Time Data Exchange (RTDX), processor in the loop (PIL), or hardware in the loop (HIL) technology may be used by communication control 126 to communicate with computing platform 160 to implement a gateway block. In another embodiment of the present invention, the gateway block can be built using the PIL technology featured in Embedded Target for Motorola MPC555 from Math Works of Natick, Mass., or TargetLink from dSPACE of Germany. One of ordinary skill in the art will appreciate that there are many technologies that can be used to construct a gateway block that is suitable to use in the present invention. In another embodiment of the present invention, block 204' can be a co-simulation block, such as one from The MathWorks' product EDA Simulator Link, to communicate between the host computer and the computing platform that executes the standalone code implementation.

In one embodiment of the present invention, block 204' can be viewed as the equivalent of block 204 that is in the standalone code implementation 144. A user can choose to compare output signals from block 204 with output signals from block 204'. Hence block 204' is the part of the standalone code implementation 144 that the user wishes to compare with block 204. A user can use a difference block 256 to compare the output signals from blocks 204 and 204'. Difference block 256 takes the output signals of block 204' and subtracted from the output signals of block 204. The output of the difference block 256 can then be supplied to sink block 212.

Implementation 220 also includes block 206' that receives signals via input port 246. Switch 222 can be provided to choose between output signals from block 204 and the ones from block 204'. Hence, a user can choose if block 206' will have the same inputs as block 206 and to prevent error propagation from one block to another. On the other hand, a user might want to know the cumulative error in the implementation 220 relative to implementation 200 so that in this case, the user would want to use output signals from block 204' to feed into block 206'. Block 206' has an output port 248 where a signal exits block 206'. Again, a use can choose to compare output signals from block 206 and block 206' via a difference block 258. Difference block 258 takes the output signals from block 206' and subtracted from the ones from block 206. The results from the difference block 258 are then inputted to sink block 214. Switch 224 allows a user to choose an input signal to block 208' via input port 250. If switch 224 is used to choose output signals from block 206, then block 208' will have the same input signals as block 208. Alternatively, if switch 224 is used to choose output signals from block 206', then errors in the output signals of block 206' are included as part of the input signals into block 208'. Block 208' output signals via output port 252 and the signals are inputted to sink block 210' via its input port 254. Output signals from 208 and block 208' are compared using difference block 260 and the output from the difference block 260 is then inputted into block 216. Outputs from blocks 204', 206' and 208' are considered as intermediate outputs of the implementation 220 as they are not inputs or the final outputs of the implementation 220. Hence the present invention provides a method and a system to compare intermediate outputs of different implementations.

One of ordinary skill in the art will appreciate that there are many ways to compare two signals and difference blocks 256, 258, and 260 are merely examples. Additionally, a user can choose if he wants to compare signals at every block, such as shown in FIG. 6, or only at specific blocks. Furthermore, a user can also choose to compare outputs from two models, where each model can include more than one smaller model. If implementation 200 is used to generate code to embed in computing platform 160 and implementation 220 is used to represent the execution of the generated code on the target platform, then the comparison/verification model can be automatically generated and the user just needs to specify which signals that the user wishes to compare. One of ordinary skill in the art will further appreciate that the comparison/verification model shown in FIG. 6 can also be used in systems such as shown in FIG. 2 and FIG. 4. When implementation 220 is automatically generated from a design that implementation 200 simulates, then the comparison/verification model can be automatically generated. Otherwise, a user may need to define what each block is corresponding to so that the user can choose later what signals from what blocks the user wishes to compare.

Block 204', block 206', block 208' and block 210' can be implemented as gateway blocks that is described in the U.S. patent application Ser. No. 11/028,172. A gateway block may transmit and receive data for exchange between the application 120 and the computing platform 160. A gateway block can contain discrete components capable of accomplishing a variety of tasks. For example, the gateway block can include a component for use in passing the input data and parameters of a function to be executed to the external processor, a component for use in executing the function, and a component which retrieves the intermediate outputs from the target platform. Using a plurality of discrete components designed for accomplishing individual tasks, the interaction between the application 120 and the computing platform 160 can be separated.

In one embodiment of the present invention, a communication channel can be set up by the gateway block or the application 120 to communicate with computing platform 160. An application program interface (API) containing a set of routines and protocols necessary for initialing control and data transfer communications to the target platform can be used. By invoking the API's individual functions of the processor in the external environment can be called with input data and parameters provided from the model environment for use in the processor environment. Additionally, with the API, several functions residing on the computing platform 160 can be called. Furthermore, for each target platform or external processor, using the API the application 120 can manage all context switching associated with calling the function, such as saving and restoring context, setting the program counter, setting a breakpoint at the end of the called function, and executing standalone code implementation on the target platform or external processor. After the function has executed, the API can be used in retrieving the output data via the communication channel for use in the block diagram model.

One of ordinary skill in the art will appreciate that although blocks 204', 206', 208' and 210' have been described to communicate with the same target platform, blocks in one model can communicate with different target platforms or external processors. The combination of the different target platforms and/or external processors can be viewed as one big system that communicates with one model. One of ordinary skill in the art will also appreciate that FIGS. 5 and 6 are merely exemplary block diagram models that can be used to practice with the present invention, and other graphical models or textual models can also be used to practice with the present invention.

Figure 7:
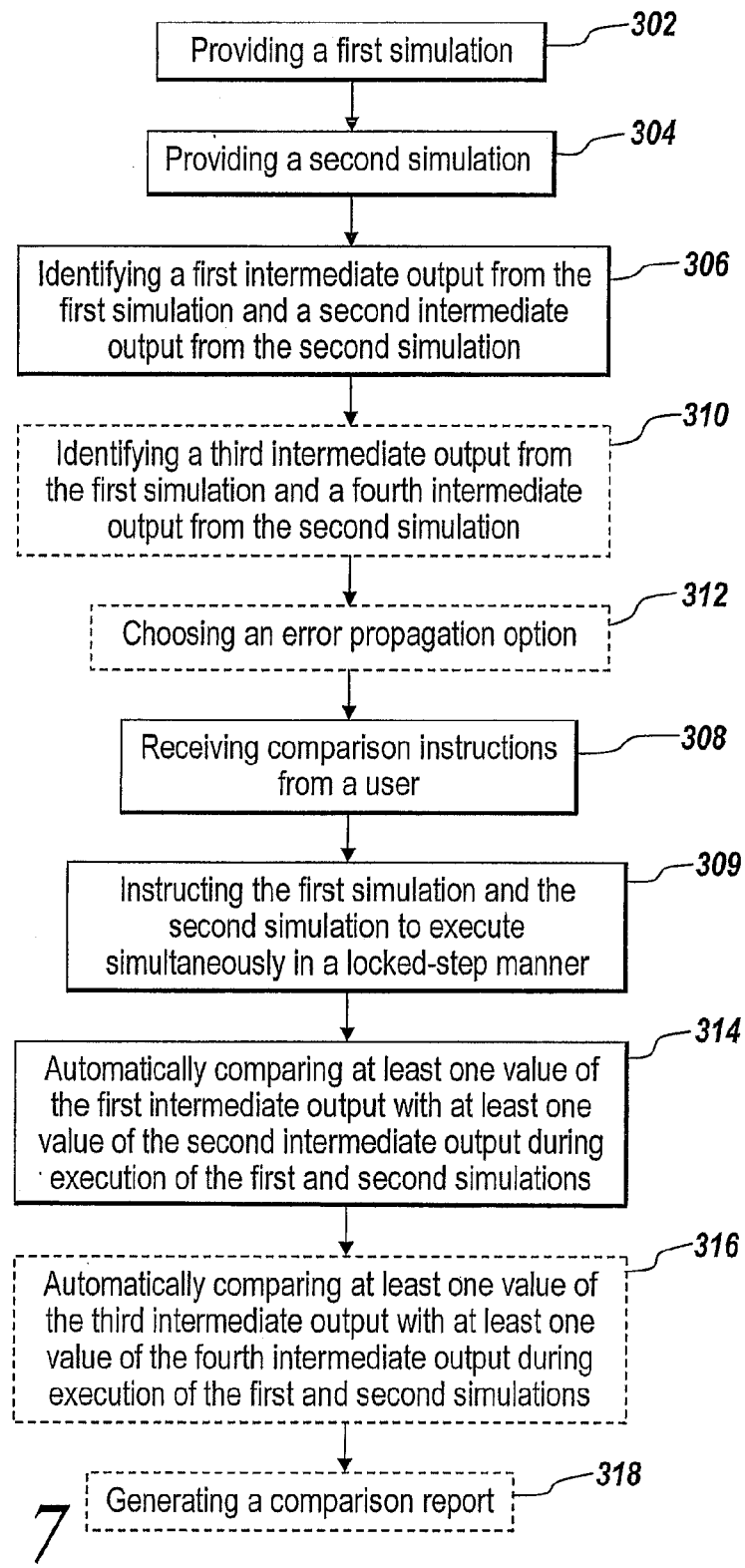
FIG. 7 is a flowchart depicting the steps taken to practice an embodiment of the present invention corresponding to the system illustrated in FIG. 2.

FIG. 7 illustrates a flow chart depicting exemplary processing taken to practice one embodiment of the present invention according to the system shown in FIG. 2. At step 302, a first simulation is provided to application 120. A second simulation is then provided to application 120 at step 304. The first and second simulations mayor may not be executed by the same application or on the same host computer. Communication control 126 can communicate with an external application (not application 120) if the external application is executing the on a host computer that is not the one that executes application 120. A user then identifies a first intermediate output from the first simulation and a second intermediate output from the second simulation in step 306. A user may optionally identify more intermediate outputs for comparison, such as a third intermediate output from the first simulation and a fourth intermediate output from the second simulation in step 310. A user may then choose an error propagation option in step 312. For example, in FIG. 6, a switch is used to provide the user the option to choose if the user wants to accumulate errors from the earlier execution portions or previous block. Comparison instructions are received from a user in step 308. The comparison instructions may specify, but not limited to, number of test runs (per input source, tuned parameter, data routing configuration), range of system input sources, range of subsystem-level design parameter values, range of independent subsystem-level error tolerances, range of accumulated subsystem-level error tolerances, and range of reporting metrics and formats, Comparison mechanism 124 will use the comparison instructions provided by the user to make comparisons between intermediate outputs. In step 309, the first simulation and the second simulation are simultaneously executed in a locked-step manner. In step 314, at least one value of the first intermediate output and at least one value of the second intermediate output are automatically compared during execution of the first and second simulations. Other identified intermediate outputs will also be automatically compared during execution of the first and second simulations, such as in step 316, at least one value of the third intermediate output and at least one value of the fourth intermediate output are automatically compared.

Lastly, a comparison report can be generated in step 318. The report can include statistics that include, but not limited to, error rates, error distribution, and sensitivity. Error rates can be any commonly used error rate or ally user-defined error rate, such as mean time before error, mean time between errors, errors per unit time, and errors per run. Error distribution can include a commonly used distribution, or any user-defined distribution, such as a probability distribution function and a probability density function. Sensitivity can include, but not limited to, independent subsystem-level sensitivity to subsystem input, accumulated subsystem-level sensitivity to application input, independent subsystem-level sensitivity to subsystem parameters, and accumulated subsystem-level sensitivity to parameters. Commonly used statistic tools may be included as part of the application 120. Application 120 can also provide mechanisms so that a user can use a custom defined function implemented in a technical computing application, such as the MATLAB® programming environment, to calculate a user defined error rate, user defined error distribution, or user defined sensitivity. The report may also include statistics that include percentage of occurrences in which differences in value of two intermediate outputs are greater than a user-defined tolerance. The report may additionally include figures, such as plots of differences as a function of time, bar graphs showing sensitivity metrics of different intermediate outputs, pi charts showing percentage of error contribution factors.

Figure 8:
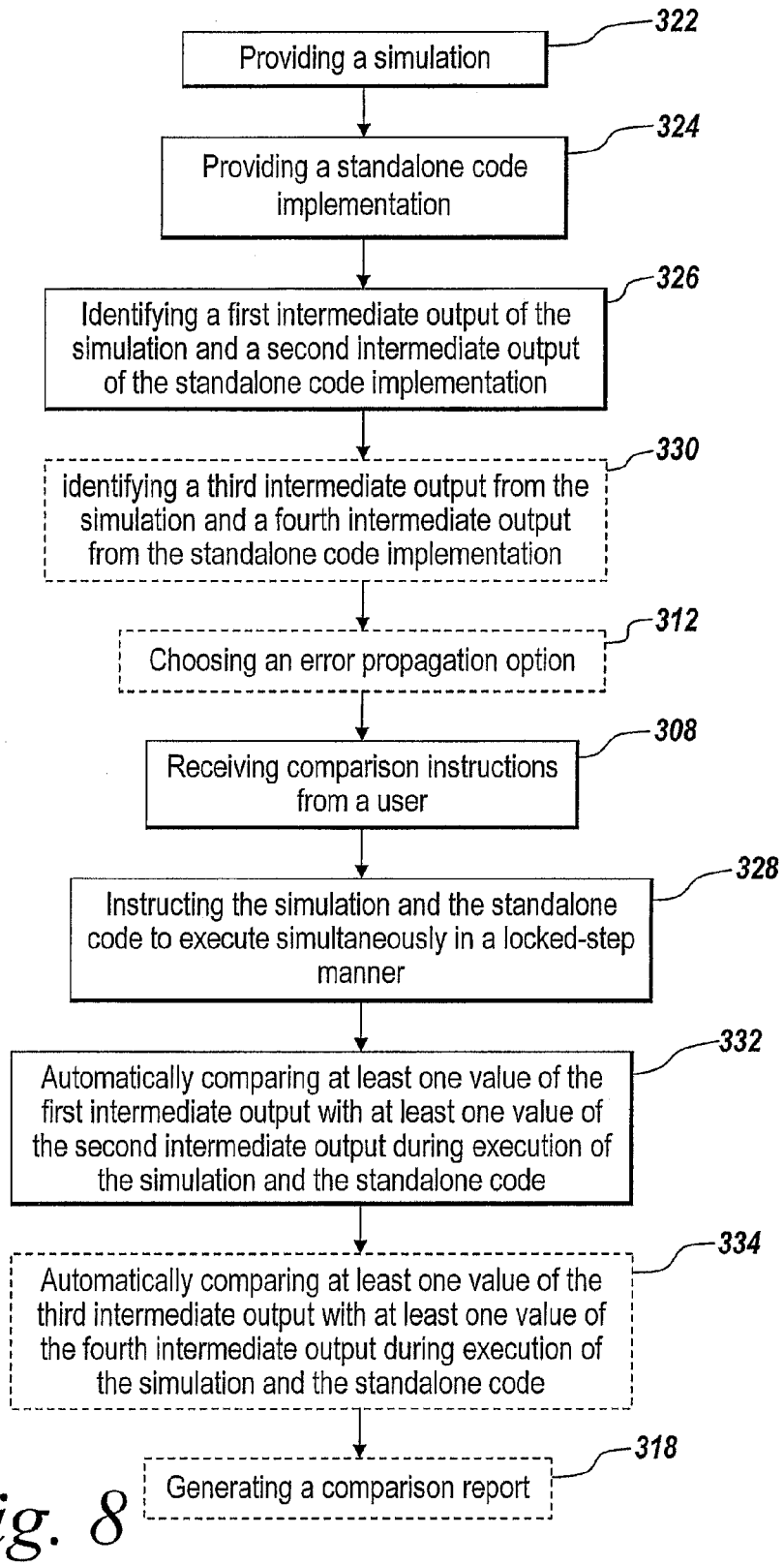
FIG. 8 is a flowchart depicting the steps taken to practice another embodiment of the present invention corresponding to the system illustrated in FIG. 3.

FIG. 8 depicts a flowchart illustrating exemplary processing taken to practice one embodiment of the present invention according to the system shown in FIG. 3. In step 322, a simulation is provided to application 120. A standalone code implementation in then provided in step 324. In one embodiment of the present invention, the standalone code implementation is automatically generated from a design using information regarding the computing platform, where the design is simulated by the simulation. The simulation mayor may not be executed by the application 120. Communication control 126 can communicate with an external application (not application 120) if the simulation is executed on a host computer that does not execute application 120. Communication control 126 can also communicate with the computing platform executing the standalone code implementation. A first intermediate output in the simulation and a second intermediate output in the standalone code implementation are identified in step 326. A user may additional identify other intermediate outputs for comparison, such as in step 330, a third intermediate output from the simulation and a fourth intermediate output from the standalone code implementation are identified for comparison. A user may further choose an error propagation option in step 312. After receiving comparison instructions from a user in step 308, the simulation on a host computer and the standalone code implementation on the computing platform are then simultaneously executed in a locked-step manner in step 328. Comparison mechanism 124 uses the received comparison instruction information as guidelines for comparing intermediate outputs. In step 332, at least one value of the first intermediate output and at least one value of the second intermediate output are automatically compared during execution of the simulation and the standalone code implementation. If other intermediate outputs were identified previously for comparison, they would also be automatically compared during execution of the simulation and the standalone code implementation, such as in step 334, at least one value of the third intermediate output with at least one value of the fourth intermediate output are automatically compared during execution of the simulation and the standalone code implementation. Lastly, a comparison report can be generated in step 318.

Figure 9:
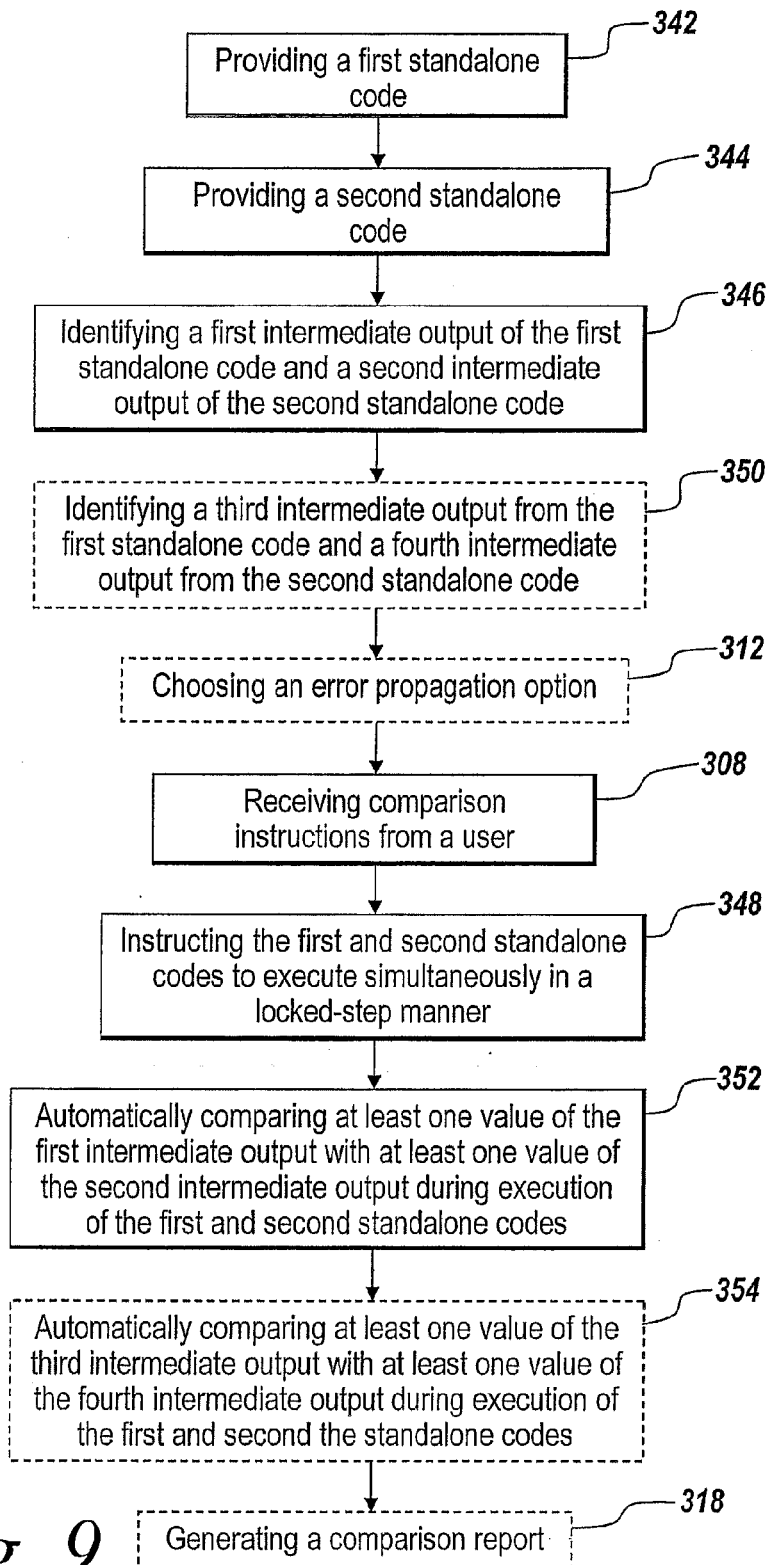
FIG. 9 is a flowchart depicting the steps taken to practice a further embodiment of the present invention corresponding to the system illustrated in FIG. 4.

FIG. 9 depicts a flowchart illustrating exemplary processing taken to practice one embodiment of the present invention according to the system shown in FIG. 4. In step 342, a first standalone code implementation is provided. A second standalone code implementation is provided in step 344. Communication control 126 is responsible for communicating with the one or more computing platform that executes the first or second standalone code implementation. In step 346, a first intermediate output in the first standalone code implementation and a second intermediate output in the second standalone code implementation are identified for comparison. A user may choose to identify more intermediate outputs for comparison, such as in step 350, a third intermediate output from the first standalone code implementation and a fourth intermediate output from the second standalone code implementation are identified for comparison. A user may also additional choose an error propagation option in step 312. Comparison mechanism 124 receives in step 308 comparison instructions from a user. Comparisons between intermediate outputs will be made according to the comparison instructions. In step 348, the first and second standalone code implementations are executed simultaneously in a locked-step manner. At least one value of the first intermediate output with at least one value of the second intermediate output are automatically compared during execution of the first and second standalone code implementations in step 352. If other intermediate outputs were previously identified, they would also be automatically compared, such as in, step 354, at least one value of the third value with at least one value of the fourth intermediate output are automatically compared during execution of the first and second standalone code implementations. Lastly, a comparison report can be generated in step 318.

The present invention provides a method for comparing and/or verifying by a user using user-defined information and/or rules. Reports can also be automatically generated using user-defined information and/or rules. The present invention relieves the user the burden to write manual code to compare two implementations. The present invention also relieves the user the burden to write manual code to communicate with an external computing platform to send instructions and retrieve execution data. The present invention allows easy verification between original design and the automatically generated standalone code implementation from the original design. The present invention also allows easy comparisons among a number of different simulations and/or standalone code implementations, such as multiple implementation techniques for a given computing platform, multiple automatically generated standalone code implementations from one design for multiple different computing platforms, simulations of a design with different optimization techniques, simulations of a design using different combinations of computing platforms.

Figure 10:
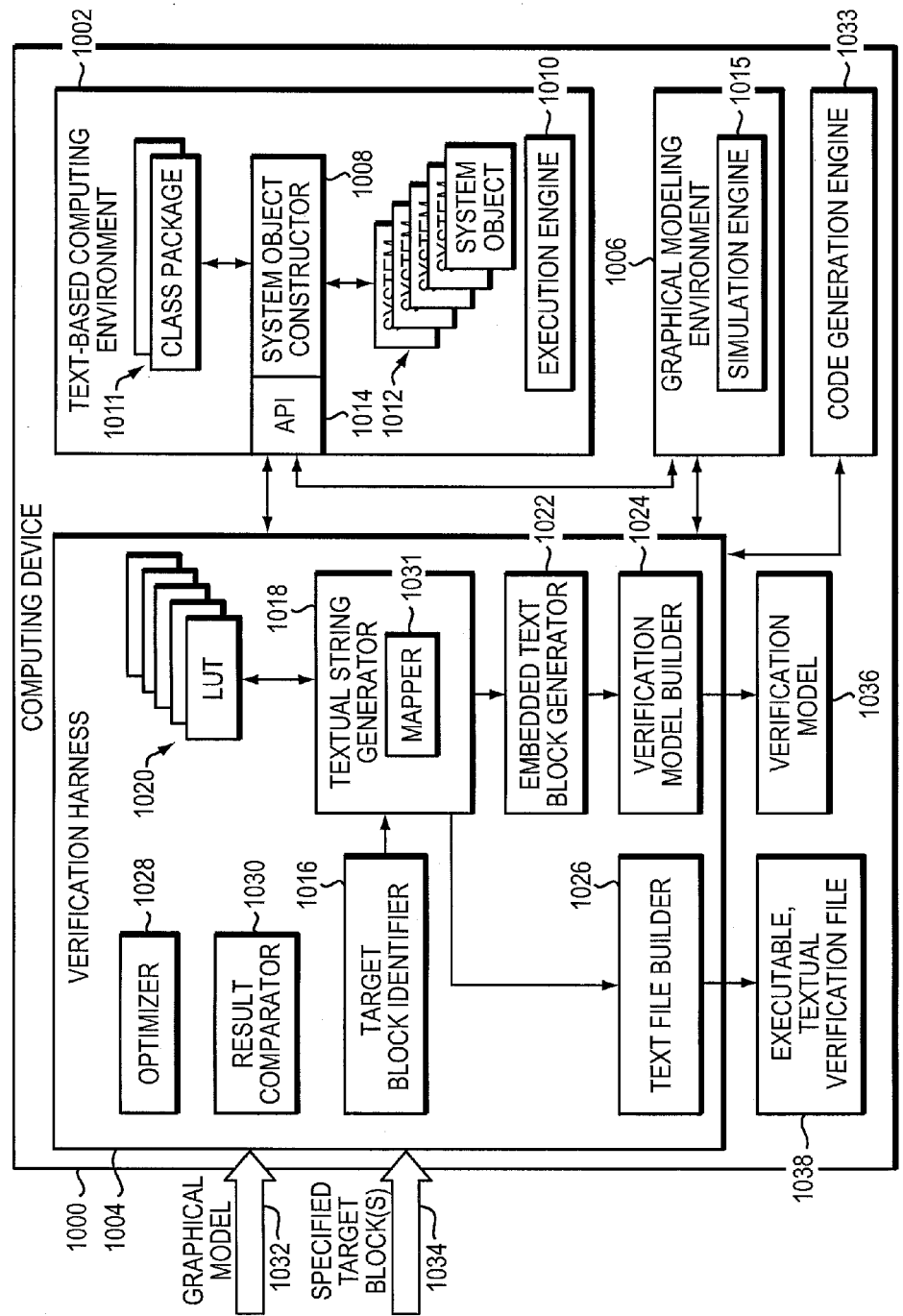
FIG. 10 is a schematic illustration of a computing device in accordance with a further embodiment of the present invention.

FIG. 10 is a schematic illustration of a computing device 1000 in accordance with a further embodiment of the present invention. The computing device 1000 includes a text-based computing environment 1002, a verification harness 1004, and may also include a graphical modeling environment 1006. The text-based computing environment 1002 includes a system object class constructor 1008 and an execution engine 1010. The system object constructor 1008 is configured to access one or more class packages 1011, and define and instantiate system objects, such as system objections 1012. The system object constructor 1008 may be accessed by other components, such as the verification harness 1004 and the graphical modeling environment 1006, through an Application Programming Interface (API) layer 1014. The graphical modeling environment 1006 may include a simulation engine 1015 that is configured to run graphical models. The computing environment 1000 may also include a code generation engine 1033.

The verification harness 1004 may include a plurality of components or modules. Specifically, the verification harness 1004 may include a target block identifier 1016, a textual string generator 1018, a plurality of look-up tables (LUTs) 1020, an embedded text block generator 1022, a verification model builder 1024, a text file builder 1026, an optimizer 1028, and a result comparator 1030. The textual string generator 1018 may include a mapper 1031.

A suitable text-based computing environment 1002 is the MATLAB® programming environment, which is a dynamically typed, matrix-based programming system. A suitable graphical modeling environment is the Simulink® model-based design system.

It should be understood that the arrangement of FIG. 10 is for illustration purposes only and that this embodiment of the present invention may implemented in other ways. For example, the verification harness 1004 and/or the code generation engine may be included within text-based computing environment 1002 itself, the mapper 1031 may be included in the LUTs 1020, etc.

As described herein, the verification harness 1004 receives a selected graphical model, as illustrated by arrow 1032, and one or more specified target blocks, as indicated by arrow 1034. The verification harness 1004 is configured to automatically generate a verification model 1036 and/or one or more executable text files 1038. The verification harness 1004 is further configured to perform simulation verification between the selected graphical model and the verification model 1036 and/or the text files 1038. Specifically, the verification harness 1004 may run or execute the selected graphical model and the verification model 1036 and/or the one or more executable text files 1038, and compare the results produced thereby.

The target block identifier 1016, textual string generator 1018, LUTs 1020, embedded text block generator 1022, verification model builder 1024, text file builder 1026, optimizer 1028, and result comparator 1030 as well as the system object class definition 1008 may be or may include software modules or libraries containing program instructions pertaining to the methods described herein, that may be stored on computer readable media, such as memory 108 (FIG. 1), and executable by one or more processing elements, such as processor 106A and/or 106B. Other computer readable media may also be used to store and execute these program instructions. In alternative embodiments, various combinations of software and hardware, including firmware, may be utilized to implement the present invention.

Figure 11A:
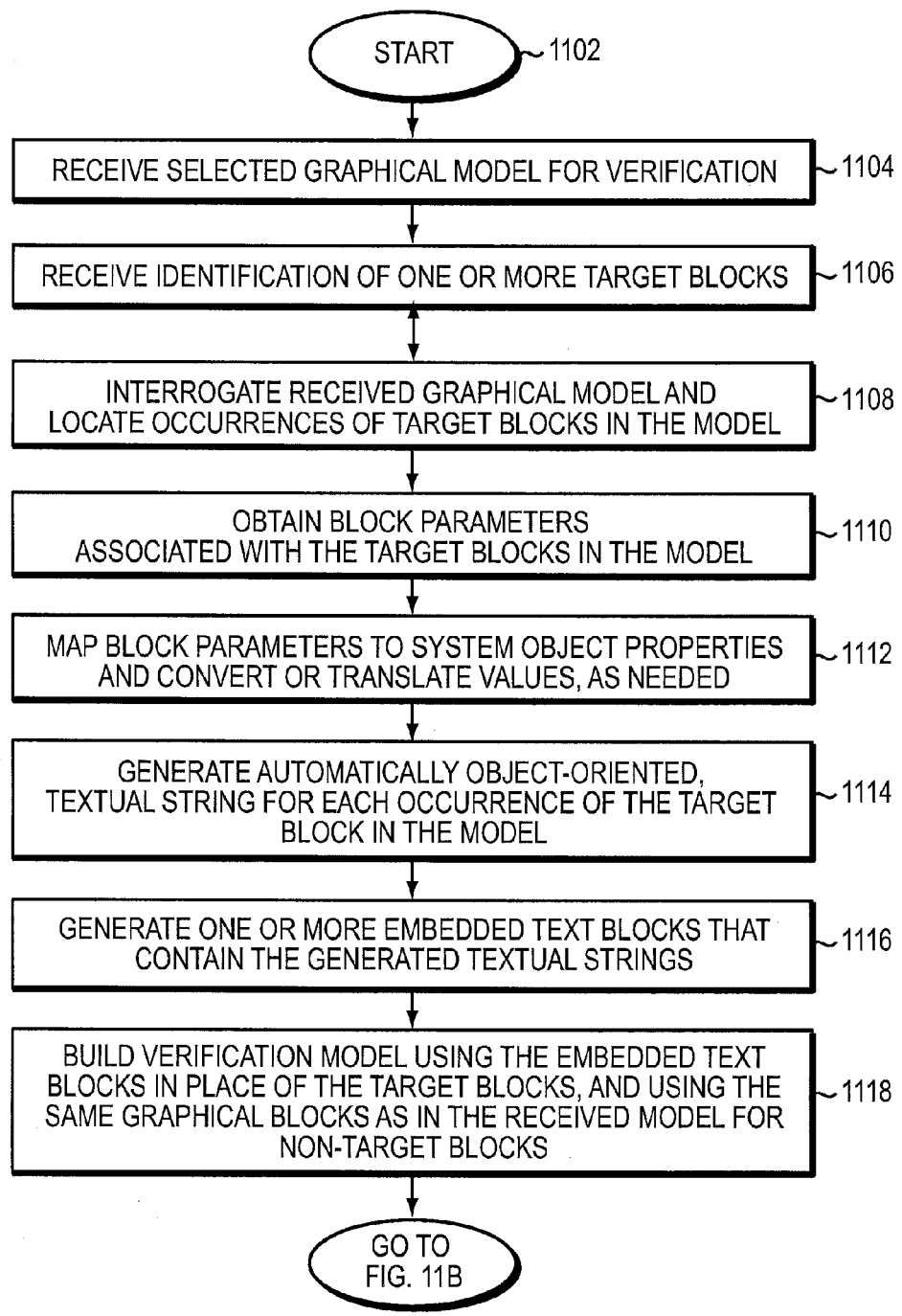
FIGS. 11A-B are partial views of a flow diagram of an exemplary method in accordance with embodiments of the present invention.
Figure 11B:
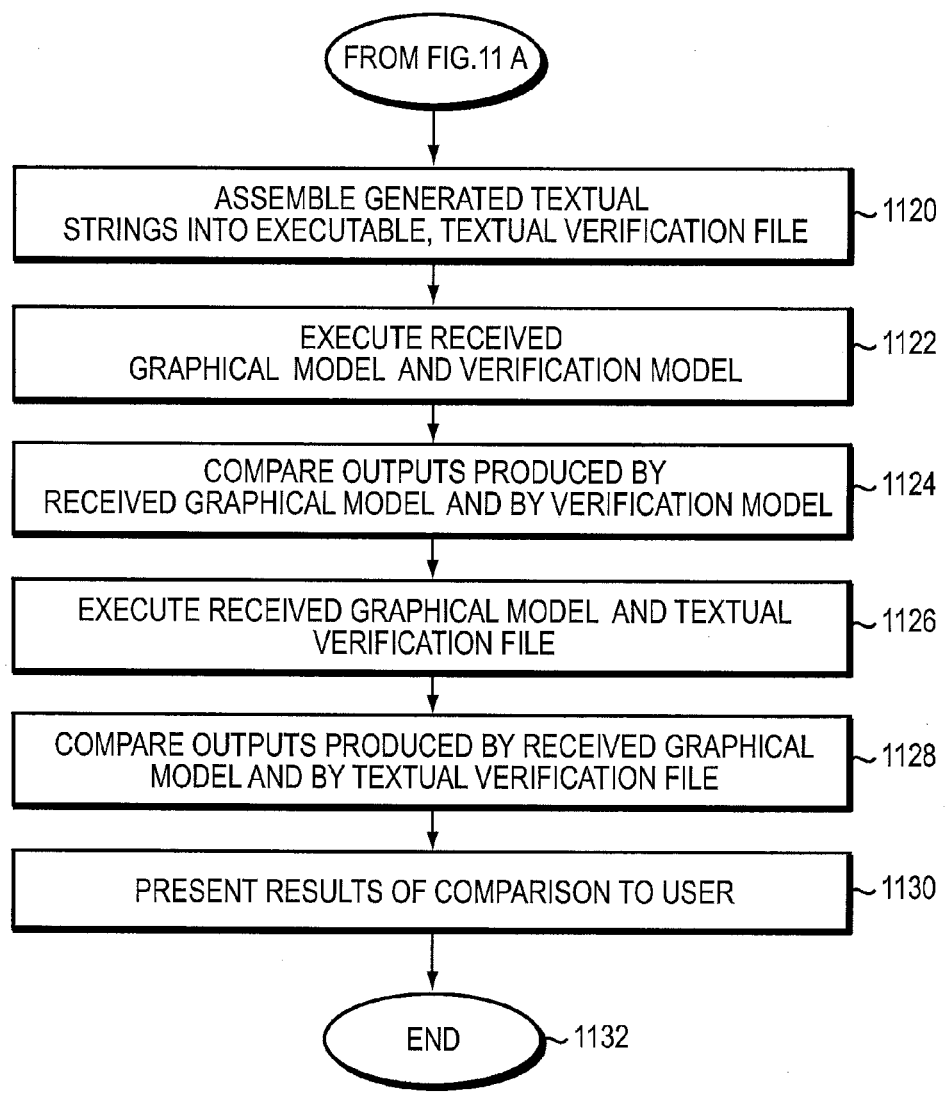

FIGS. 11A-B is a flow diagram of a method in accordance with this further embodiment of the present invention. Processing may begin at start block 1102. A user of the computing device 1000 selects a graphical model to be verified by the verification harness 1004 (block 1104). The user may create the selected graphical model to be verified or may select a saved model. For example, and referring to FIG. 12, graphical model 1200 may be selected for verification by a user. The graphical model 1200 may be presented in a Graphical User Interface (GUI), such as a model editor window 1202 generated by the graphical modeling environment 1006, and presented on visual display device 116 (FIG. 1). The model editor window 1202 may include a menu bar 1204, a toolbar 1206 and a canvas 1208. The menu bar 1204 may contain a plurality of user-selectable commands, which may be organized into drop down lists, such as File, Edit, View, etc. The toolbar 1206 may include a plurality of user-selectable icons, such as New, Open, Save, etc., each of which may execute a respective command. The graphical model 1200 is presented on the canvas 1208.

The model 1200 includes a plurality of executable, graphical blocks that are interconnected by lines or edges. Depending on the type of graphical model, the lines may represent data flow, pathways for signals, etc. The model 1200 includes a plurality of Mean blocks 1210a-e. Each Mean block 1210, moreover, is coupled to a respective source block 1212 and a respective sink block 1214.

Figure 12:
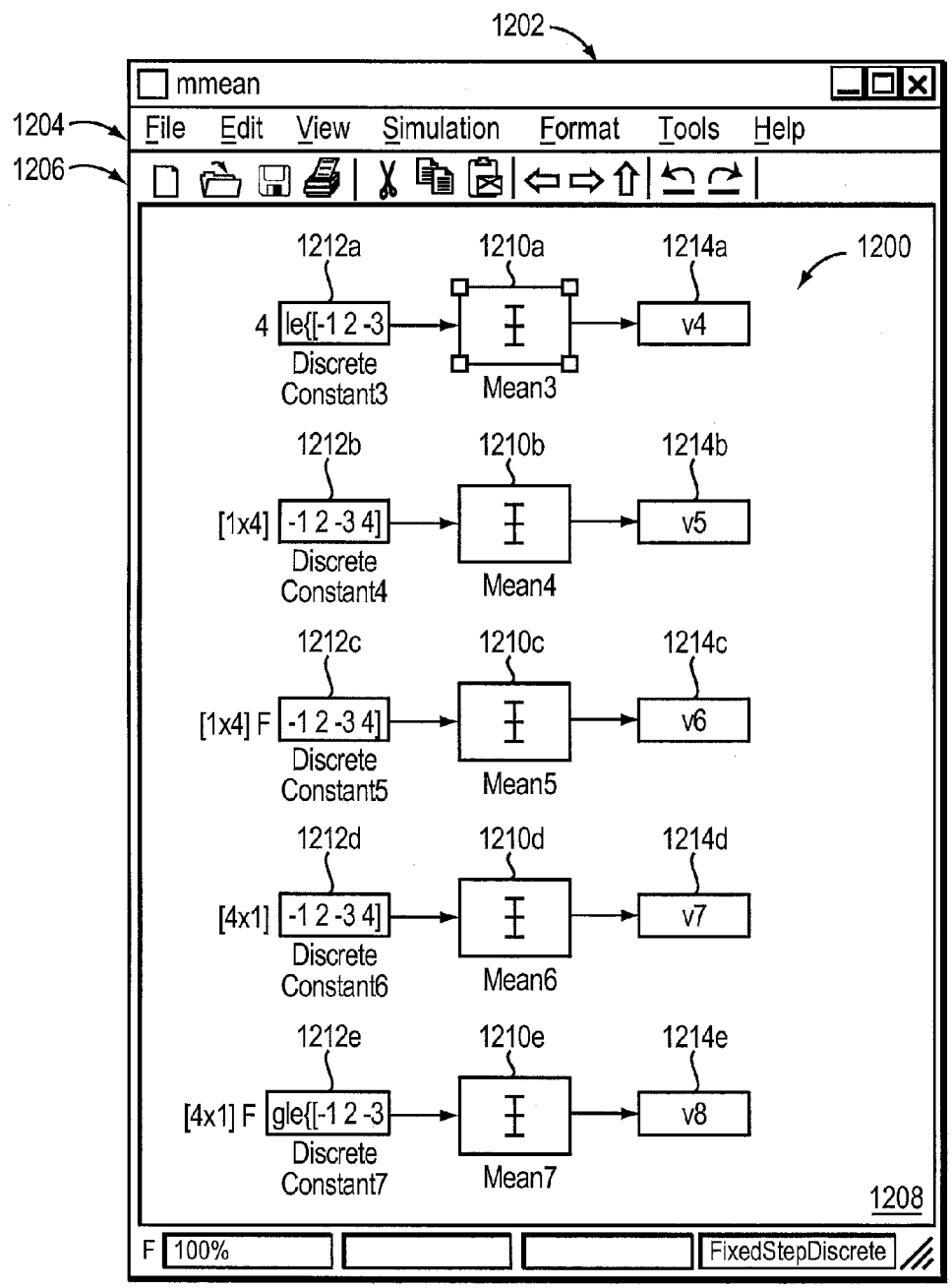
FIG. 12 is a highly schematic illustration of a graphical model that may be subject to verification in accordance with an embodiment of the present invention.

It should be understood that the graphical model 1200 of FIG. 12 is meant for illustrative purposes only and that the present invention may be used with other, possibly far more complex, graphical models.

Each block of graphical model 1200, such as the Mean blocks 1210a-e, may have one or more parameters or properties. Block parameters are attributes that may be specified by the user for the respective block, and are used during execution of the block. The user specifies an attribute of a block by setting the parameter to a corresponding value. For example, a Gain block may include a Gain parameter, a Mean block may include Running Mean and Dimension parameters, etc. The parameters of a block may be initialized to default values by the graphical modeling environment 1006. A user may set the block's parameters by calling up a parameter or property page for display on the visual display device 116.

Referring now to FIG. 11A, and in particular to block 1104, the user preferably inputs the selected model, e.g., model 1200, to the verification harness 1004. In an embodiment, the menu bar 1204 may include a "Verify Model" command. Alternatively or additionally, the toolbar 1206 may include a "Verify Model" icon.

In addition to inputting the selected model to the verification harness 1004, the user also may select one or more graphical, executable blocks of the model as target blocks, i.e., the blocks of the model that are to be verified, as indicated at block 1106. For example, upon selection of the Verify Model command, a pop window or dialog box may be presented to the user. The dialog box may include fields and command buttons for configuring the verification process. By manipulating one or more fields or buttons of the dialog box, the user may select one or more of the graphical, executable blocks of the selected graphical program for automatic verification. In an embodiment, the dialog box lists each of type of graphical, executable block that is present in the selected graphical model. The user may specify one or more types of blocks of the model as the target blocks to be verified.

It should be understood that, instead of selecting one or more target block types, the user may specify one or more particular blocks of the selected graphical model, one or more subsystem blocks, or the entire graphical model. The target block identifier 1012 may examine, e.g., parse, the received graphical model and identify each individual occurrence of the specified target block type in the selected graphical model, as indicated at block 1108. The target block identifier 1012 may pass information regarding each occurrence of the target block type in the graphical model to the textual string generator 1018. In particular, the target block identifier 1012 may determine the parameter values of each occurrence of the target block type based on its analysis of the selected graphical model, as indicated at block 1110. A block's parameters may be obtained by accessing the block mask of the block. The target block identifier 1012 also may determine the signals received by each occurrence of the target block type, i.e., the input data to the block, and the source of those signals, such as other blocks of the model. The target block identifier 1012 may also determine the signals produced by the block, i.e., the block's output data, and the other blocks of the model that receive those signals.

It should be understood that the target block identifier 1012 and the textual string generator 1018 may process an in-memory representation of the graphical model 1200 generated by the graphical modeling environment 1006.

In accordance with an embodiment of the present invention, the functionality of each target block type may be implemented through a corresponding system object 1012 instantiated by the system object constructor 1006. That is, for each target block type of the selected model, there is a corresponding system object class provided by the class packages 1011. For example, for a Mean block, there is a system object class that performs a similar mean function, for a Gain block, there is a system object class that performs a similar gain function, for a counter block, there is a system object class that performs a similar counter function. As indicated above, each executable, graphical block has a plurality of block parameters that are used by the block to implement the functionality of the block. Similarly, each system object 1012 has a plurality of object properties that are used by the system object to implement its functionality.

A suitable system object architecture for use with the present invention is described in commonly owned, co-pending U.S. patent application Ser. No. 11/519,255 filed Sep. 11, 2006 for a System and Method for Using Stream Objects to Perform Stream Processing in a Text-Based Computing Environment, which has been published as U.S. Patent Publication No. 2008/0127064 A1, and which is hereby incorporated by reference in its entirety. Notably, the application uses the term "stream object," rather than "system object" as used herein.

The textual string generator 1014 preferably accesses information in the LUTs 1020 in order to automatically generate an object-oriented, textual string implementing a corresponding system object for each occurrence of a target block type in the selected graphical model. Each LUT 1020 represents a predefined mapping between block parameters and system object properties. In most cases, however, there is not a one-to-one mapping between block parameters and object properties.

Figure 13:
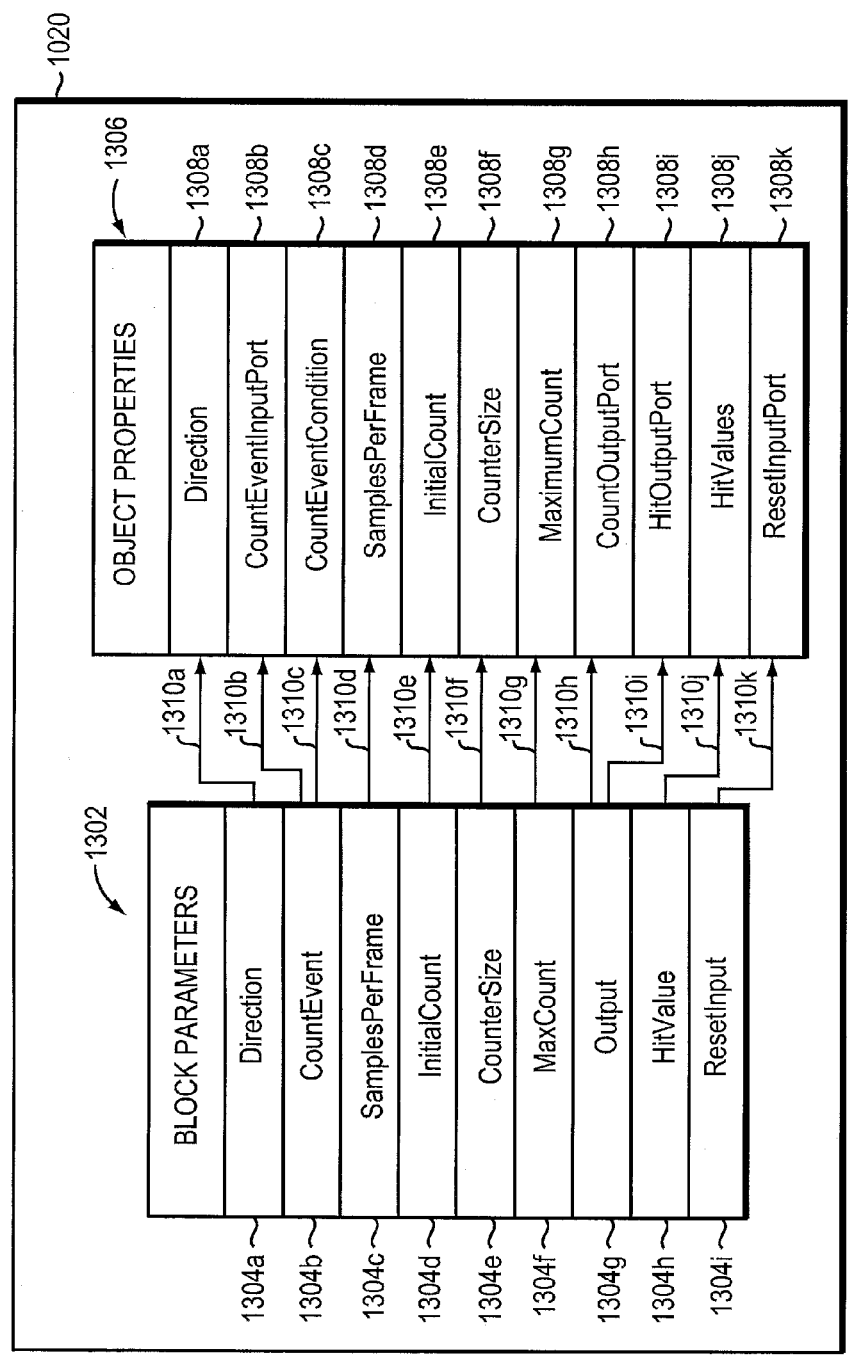
FIG. 13 is a schematic illustration of a look-up table in accordance with an embodiment of the present invention.

FIG. 13 is a schematic illustration of an exemplary LUT 1020. The LUT 1020 of FIG. 13 illustrates the mapping of block parameters for a Counter block to a corresponding Counter system object. The LUT 1020 includes a block parameter list 1302 having a plurality of entries 1304a-i, where each entry 1304 corresponds to one of the parameters of the Counter block. For example, entry 1304a corresponds to the block's Direction parameter, entry 1304b corresponds to the block's CountEvent parameter, entry 1304c corresponds to the block's SamplePerFrame parameter, etc. The LUT 1020 further includes a system object property list 1306 having a plurality of entries 1308a-k, where each entry corresponds to a property of the respective system object. For example, entry 1308a corresponds to the system object's Direction property, entry 1308b corresponds to the system object's CountEventInputPort property, entry 1308c corresponds to the system object's CountEventCondition property, etc.

As shown, while the Counter system object performs essentially the same function as the Counter block of the graphical model, the property types of the system object are not exactly the same as the parameter types of the block. Nonetheless, the LUT 1020 provides a mapping of each block parameter to one or more properties of the system object, as illustrated by arrows 1310a-k. Some block parameters map to a single system object property. For example, the Direction parameter 1304a maps to the Direction object property 1308a, the SamplesPerFrame parameter 1304c maps to the SamplesPerFrame object property 1308d, and the MaxCount parameter 1304f maps to the MaximumCount object property 1308g. Other block parameters, however, map to multiple object properties. For example, the Coun-tEvent parameter 1304b maps to both the CountEventInputPort object property 1308b and the CountEventCondition object property 1308c. Similarly, the Output parameter 1304g maps to the CountOutputPort property 1308h and the HitOutputPort property 1308i.

In an embodiment, the mapping of block types to system object classes as well as the mapping of block parameters to system object properties is predefined and stored at the LUTs 1020 of the verification harness 1004. The mapping may be defined manually based on a review of the block types supported by the graphical modeling environment 1006 and the object classes defined by the class packages 1011. It should be understood that, in some cases, there may not be a suitable system object class for a given block type.

It should be understood that graphical blocks may be mapped to system objects based on name, as stored at the LUTs 1020. That is a Mean block may map to a Mean system object. A Counter block may map to a Counter system object. It should be further understood that a graphical block may map to a system object of another name. As mentioned above, the mapping of graphical blocks to system objects may be predefined and stored at the LUTs 1020. A single graphical block, moreover, may map to multiple system objects, and multiple graphical blocks may map to a single system object. The desired mapping may be implemented through the mapper 1031.

Figure 13A:
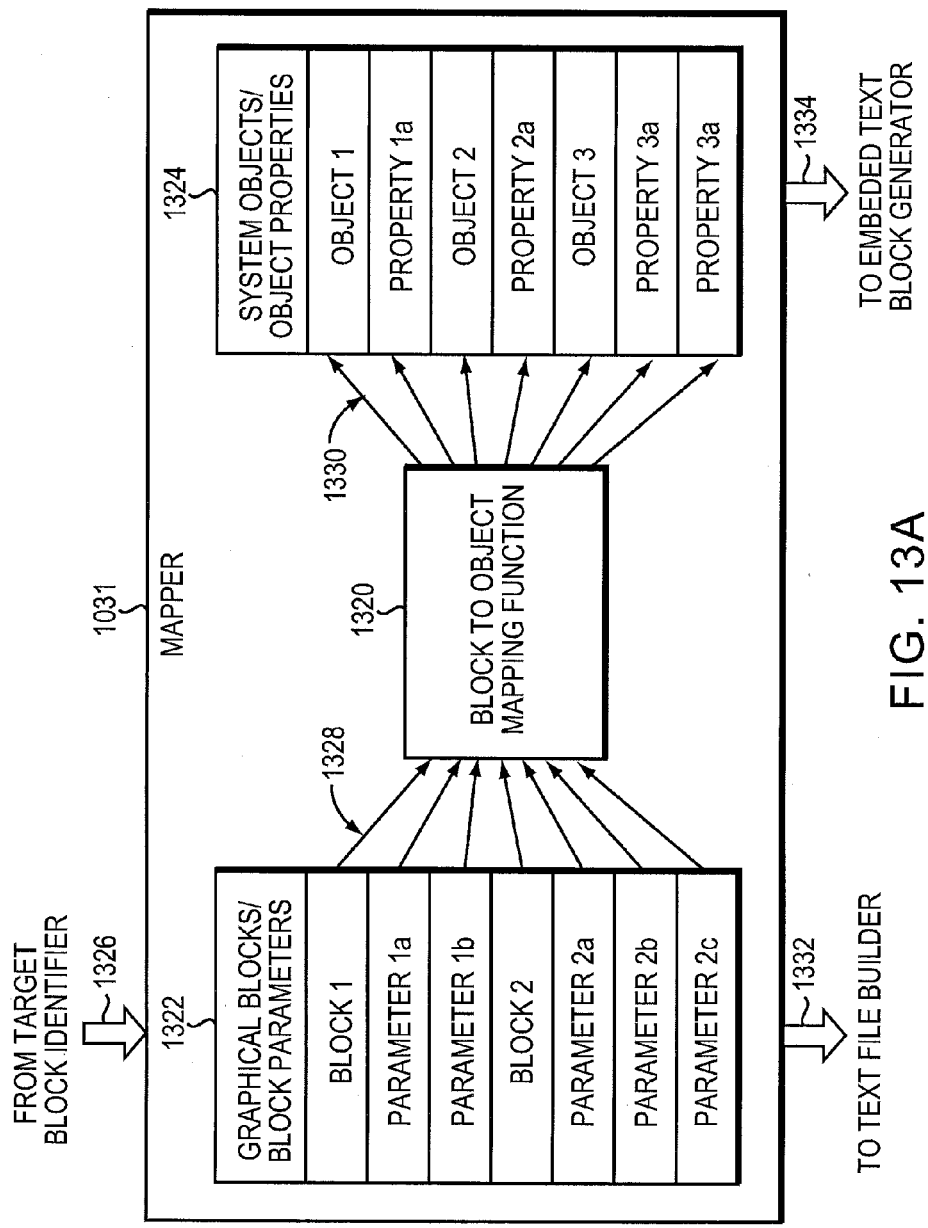
FIG. 13A is a schematic illustration of a mapping function in accordance with an embodiment of the present invention.

FIG. 13A is a schematic illustration of an embodiment of the mapper 1031. The mapper 1031 may include a mapping function 1320, executable by a processor, that maps graphical blocks and block parameters to system objects and object parameters in a predetermined manner. Illustratively, a first list 1322 or other data structure contains information on the graphical blocks and their respective block parameters, and is connected to the mapping function 1320. A second list 1324 or other data structure contains information on the system objects and their respective object properties, and is also connected to the mapping function 1320. As indicated by arrow 1326, the mapper 1031 receives information from the target block identifier 1016, such as the types of target blocks in the subject graphical model and their parameters. As illustrated by arrows 1328 and 1330, the mapping function 1320 implements a predetermined association of graphical blocks and block parameters with corresponding system objects and object parameters. The mapping function 1320 may be designed to provide a one-to-many mapping or a many-to-many mapping between blocks and block parameters, and system objects and object properties. The system objects and object properties that are determined by the mapping function 1320 to correspond to the identified target blocks and block parameters may be provided to the text file builder 1026 and/or the embedded text block generator 1022, as indicated by arrows 1332 and 1334.

It should be further understood that, in addition to mapping block parameter types to object property types, the values of a block parameter also may need to be translated, converted or otherwise modified as they are mapped to one or more system object properties, as indicated at block 1112. In an embodiment, the LUTs 1020 are implemented through code snippets that, when executed, e.g., by the mapper 1031 of the textual string generator 1018, map block parameters to object properties and perform any conversion or processing of the block parameter values that may be required. In an embodiment, the code snippets may be written in a format that is executable by the execution engine 1010 of the text-based computing environment.

FIGS. 14A and 14B are partial views of an illustration of a code snippet 1400 for mapping block parameters to system object properties. The code snippet 1400 is written in the MATLAB® programming language. The parameters of a given block may be organized by the LUTs 1020 in a structure, such as a cell array having named data containers called fields. The fields of the structure may contain the names of the block parameters as well as their values. The code snippet 1400 may implement, e.g., execute, a function, such as "getMap", as indicated by line 1402 of the code snippet 1400. The getMap function takes in a block parameter structure contained in 'this', and outputs a system object property structure, e.g., 'props' for use by the textual string generator 1018 in creating a corresponding textual string for the respective block. The block parameter structure may be assigned to a variable named 'params,' as indicated by line 1404.

For those block parameter values that can be assigned directly to a system object property value, an assignment statement may be used, such as assignment 1406, which assigns the block parameter Direction to the system object property of the same name, and assignment 1408, which assigns the block parameter InitialCount to the system object parameter of the same name. For other block parameters condition statements, such as 'switch' statements, may be used to perform the mapping of block parameters to system object properties. A first condition section 1410 may be used to evaluate the block parameter "CountEvent" and assign values to one or more system object properties depending on the value of the block's CountEvent parameter. For example, if the CountEvent parameter is set to 'Rising edge', then the system object property CountEventInputPort is set to 'true', as indicated by line 1412, and the system object CountEventCondition is set to 'Rising edge', as indicated by line 1414. Alternatively, if the block's CountEvent parameter is set to 'Free running,' then the system object's CountEventInputPort property is set to 'false', as indicated by line 1416, and the object's SamplesPerFrame property is set to the same value as the block's SamplesPerFrame property, as indicated by line 1418.

A second condition section 1420 of the code snippet 1400 evaluates the block's CounterSize parameter, and sets the system object's CounterSize and MaximumCount properties. A third condition section 1422 evaluates the block's Output parameter, and sets the system object's CountOutputDataType, CountOutputPort, and HitOutputPort properties, among others. A fourth condition section 1424 evaluates the block's ResetInput parameter, and sets the system object's ResetInputPort property.

It should be understood that the other LUTs 1020 may be implemented through other such code snippets that may be executed by the mapper 1031.

The textual string generator 1018 processes the information received from the target block identifier 1012 regarding each occurrence of the target block type in the received graphical model as well as mapping information from the mapper 1031, and automatically generates one or more, executable, object-oriented (OO) textual strings for each such occurrence of the target block type in the graphical model, as indicated at block 1114. Specifically, the textual string generator 1018 may utilize the 'props' structures that are created by running the 'getMap' function for each occurrence of the target block type in order to automatically generate an object-oriented textual string for performing the functionality of the respective occurrence of the target block type, as indicated at block 1114.

Each textual string may include one or more commands that, when executed, instantiates an instance of a system object, sets the properties of the instantiated system object, and calculates one or more outputs based on one or more specified inputs and on the system object's properties. In addition to calculating the one or more outputs, the system object may also update one or more internal states. It should be understood that two or more, or even all of these commands, may be combined into a single command, depending on the syntax supported by the system object constructor 1008.

Figure 15:
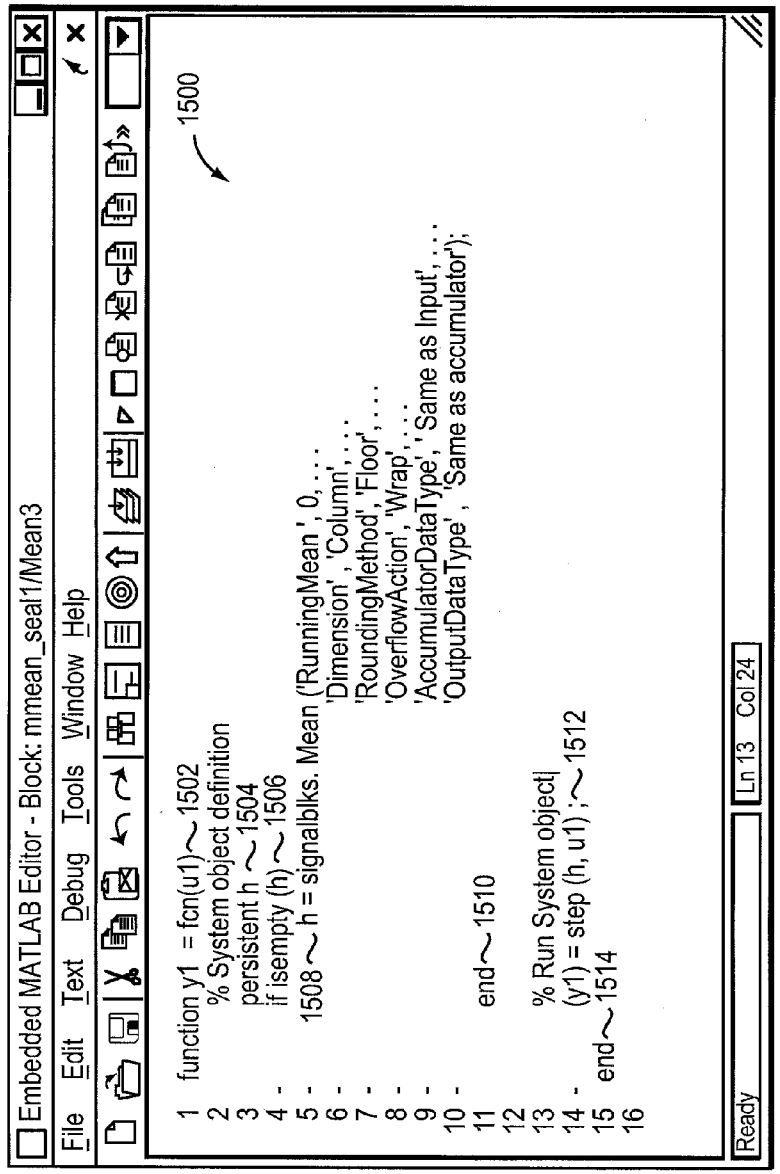
FIG. 15 is a schematic illustration of an object-oriented, textual string generated automatically in accordance with an embodiment of the present invention.

FIG. 15 is an exemplary representation of an object-oriented, textual string 1500 automatically produced by the textual string generator 1018. As shown at a first line 1502, the textual string defines a function 'fcn' that, when executed, generates an output 'y1' based on an input 'u1'. The input 'u1' and output 'y1' of the system object may correspond to the input and output signals, as represented by the arrows, of the respective block in the selected graphical model. In an embodiment, the textual string 1500 may define a persistent variable 'h', as indicated at line 1504. The textual string then may determine whether the persistent variable 'h' is empty, as indicated by line 1506. If so, the textual string 1500 may include a single command or method that both instantiates an instance of a system object and sets its properties, as indicated by line 1508. The variable 'h' may also be referred to as a handle for the system object being instantiated.

As shown, the command for instantiating the system object and setting its properties has the following syntax:

object_handle=<packagename>.<ObjectName>(property-value pair 1, property-value pair 2, property-value pair 3, . . . )

As shown in FIG. 15, the object_handle of the instantiated system object is 'h', the packagename is 'signalblks', and the ObjectName is 'Mean'.

The property-value pairs include:
   'RunningMean', 0
   'Dimension', 'Column'
   'RoundingMethod', 'Floor'
   'OverflowAction', 'Wrap'
   'AccumulatorDataType', 'Same as input', and
   'OutputDataType', 'Same as accumulator'.

It should be understood that the system object constructor 1008 may support other ways or techniques, besides the use of property-value pairs, to set the system object's properties.

The textual string 1500 also includes a line that terminates the 'if' statement, as indicated at line 1510. The textual string 1500 also includes a command that runs the instantiated object, as indicated at line 1512. The run command may have the following syntax:

output variable=step(object_handle, input variable)

The 'step' command or method causes the system object to calculate its outputs, using the inputs to the system object and the object's properties and internal states. The definition of the function 'fcn' is then terminated as indicated at line 1514.

It should be understood that an instantiated system object's properties may be set with a separate command, such as a 'Set' command. It should also be understood that the instantiation of the system object, the setting of its properties, and the running of the object all may be implemented through a single command or method.

In this way, the textual string generator 1018 may create an object-oriented, textual string automatically for each occurrence of the target block type in the selected graphical model. In an embodiment, the textual string generator 1018 may pass each generated textual string to the embedded text block generator 1022, which in turn may create an embedded text block containing the respective textual string, as indicated at block 1116. It should be understood that multiple textual strings corresponding to multiple system objects may be embedded in a single embedded text block. The embedded text blocks containing the generated strings may be passed to the verification model builder 1024. The verification model builder 1024 may be configured to create a verification model that is similar to the selected graphical model, except that, in the verification model, each occurrence of the target block type is replaced with the corresponding embedded text block that contains the textual string generated for that occurrence of the target block type, as indicated at block 1118. The verification model 1036 is designed to function like the selected graphical model that was received by the verification harness.

For those blocks of the graphical model that are not target blocks, the verification model builder 1024 uses the same executable, graphical blocks. In addition, the verification model builder 1024 assembles the verification model 1036 in the same way as the selected graphical model. The verification model 1036 created by the verification model builder 1024 may be output by the verification harness 1004.

Figure 16:
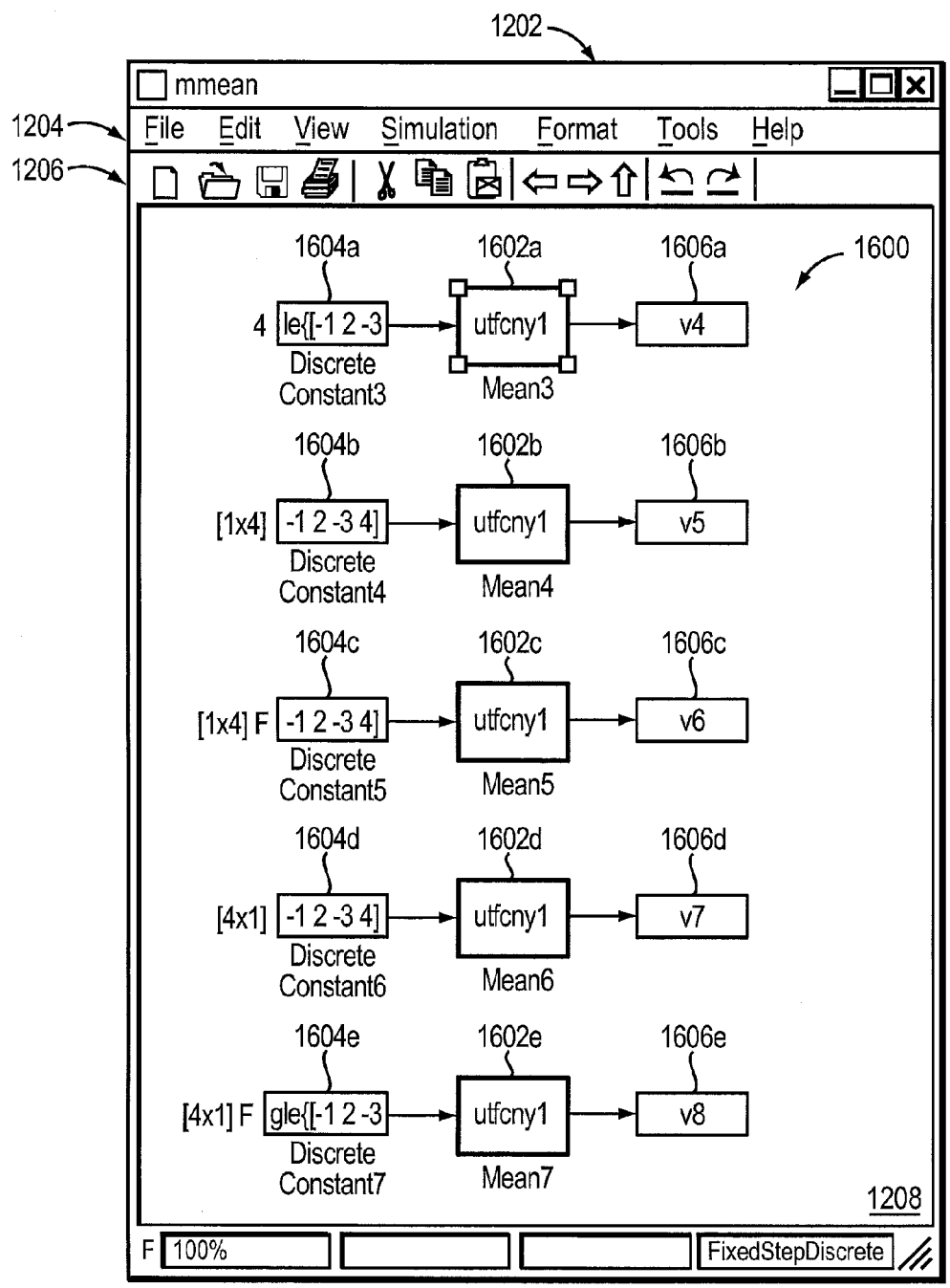
FIG. 16 is a schematic illustration of a verification model generated automatically in accordance with an embodiment of the present invention.

FIG. 16 is a schematic illustration of a verification model 1600 created by the verification model builder 1024. The verification model 1600 includes a plurality of interconnected, executable, graphical blocks. Specifically, the verification model 1600 includes a plurality of embedded text blocks 1602*a-e*. Connected to each embedded text block 1602 are a respective source block 1604 and a respective sink block 1606. Each embedded text block 1602 contains an object-oriented, textual string automatically generated by the textual string generator 1018. Specifically, embedded text block 1602*a* contains a textual string generated for Mean block 1210*a* (FIG. 12) of the selected graphical model 1200. Embedded text block 1602*b* contains a textual string generated for Mean block 1210*b*, and so on. As the source and sink blocks of the selected graphical model 1200 were not specified as target blocks, the verification model builder 1024 utilizes the same type of source and sink block as present in the selected graphical model 1200, and configures these source 1604 and sink blocks 1606 in the same way as their respective counterparts 1212 and 1214 of model 1200.

The optimizer 1028 may perform one or more optimization operations on the verification model 1600, such as block reduction and insertion. Specifically, the optimizer 1028 may be configured to reduce the number of embedded text blocks in the verification model 1600. For example, the optimizer 1028 may analyze the verification model 1600 and determine that at least some of the embedded text blocks 1602*a-e* may be combined into a single embedded text block. That is, the object oriented textual strings that represent several graphical blocks may be combined into a single embedded text block of the verification model 1600. Such an optimization may facilitate efficient code generation from the verification model 1600, e.g., by reducing overhead and reducing the number of embedded text blocks to be compiled. The optimizer 1028 may be configured to perform other optimization operations, including other operations intended to further enhance code generation from the verification model 1600.

In another embodiment, the textual string generator 1018 may pass each of the automatically generated textual strings to the textual file builder 1026. The textual file builder 1026 may assemble the textual strings into one or more executable, textual verification files, as indicated at block 1120 (FIG. 11B). These verification files may then be output by the verification harness 1004.

It should be understood that the optimizer 1028 may be configured to perform one or more optimization operations on the textual verification files, e.g., to improve code generation from those files.

To perform simulation verification, the verification harness 1004 may cause both the selected graphical model and the verification model 1036 to be run, i.e., executed, as indicated at block 1122. In particular, the verification harness 1004 may cause the simulation engine 1015 of the graphical modeling environment 1006 to run both the selected graphical model and the verification model 1036. To execute the textual strings contained in the embedded text blocks of the verification model 1036, the simulation engine 1015 may access or pass the strings to the system object constructor 1008, e.g., via the API layer 1014. The system object constructor 1008 may invoke the methods or commands of the textual strings, thereby instantiating the system objects, setting their properties, and running the system objects to produce one or more outputs. The outputs produced by the system objects may be returned to the simulation engine 1015 for further processing as part of the verification model 1036.

The outputs produced by the graphical model and the verification model 1036 may be provided by the simulation engine 1015 to the verification harness 1004. The result comparator 1030 of the verification harness 1004 may examine the results from the graphical model and the verification model 1036, and determine whether or not the results are the same, as indicated at block 1124. If a textual verification file was created by the verification harness 1004, it may be provided to the text-based computing environment 1002 for execution by the execution engine 1010 in cooperation with the system object constructor 1008, as indicated at block 1126. The results, e.g., the outputs, of the execution of the textual verification file 1038 may be provided by the text-based computing environment 1002 to the verification harness 1004. These outputs may be analyzed by the result comparator 1030, as indicated at block 1128.

The result comparator 1030 may produce a report for the user that presents the results produced by both the selected graphical model and the verification model 1036 and/or the selected graphical model and the textual verification file 1038, as indicated at block 1130. For example, the report may indicate whether the results from the various implementations are the same or not. If the results are the same, then the system objects represent an equivalent manner of implementing the functionality or procedure represented by the selected graphical model. Processing may then terminate, as indicated by end block 1132.

It should be understood that data logging probes may be added to the selected graphical model so that signals may be obtained from the graphical model and provided as inputs to the system objects instantiated by the textual verification file. Similarly, outputs of the system objects may be returned to the graphical model through data logging probes.

It should be further understood that the verification harness 1004 may be configured to verify or compare the selected graphical model 1200 with the verification model 1036 as previously described in connection with FIG. 7. Similarly, the verification harness 1004 may be configured to verify or compare the selected graphical model 1200 with the textual verification file 1038 as previously described in connection with FIG. 8.

It should be understood that the verification harness 1004 may be used solely to create the verification model 1036 and/or the textual verification files 1038 without verifying their behavior as compared to the selected graphical model.

A user may conduct further study and perform additional refinements to the verification model 1036 and/or the textual verification files 1038. The user may also compile the verification model 1036 and/or the textual verification file 1038 to generate stand-alone object code.

Figure 17:
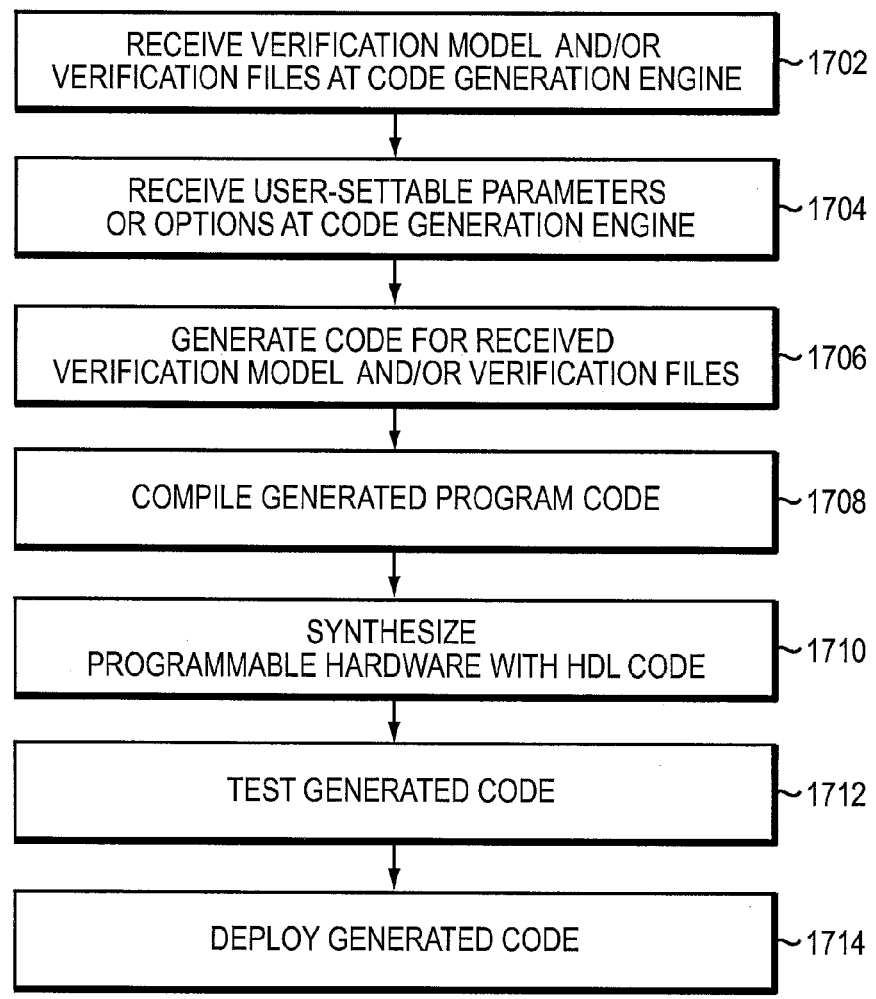
FIG. 17 is a flow diagram of an exemplary method in accordance with an embodiment of the present invention.

FIG. 17 is a flow diagram of a method in accordance with an embodiment of the invention in which computer code is generated from the verification model 1600 and/or the textual verification files 1038. Specifically, the verification model 1600 and/or the textual verification files 1038 may be received by the code generation engine 1033, as indicated at block 1702. The code generation engine 1033 may also receive one or more user-specified options or parameters, such as the type or format of code to be generated, the portion of the verification model or verification files for which code is to be generated, etc., as indicated at block 1704. The code generation engine 1033 may be configured to generate code that complies with a high-level computer software programming language, such as C, C++, Ada, etc. The code generation engine 1033 also may be configured to generate code that complies with a Hardware Description Language (HDL), such as VHDL, Verilog, SystemVerilog, SystemC, etc. In addition, the code generation engine 1033 may be configured to generate instructions that are suitable for a custom hardware platform, such as a microprocessor, microcontroller, or digital signal processor, etc., a platform independent assembly that can be re-targeted to other environments, or just-in-time code (instructions).

Suitable code generation engines for use with the present invention include the Real Time Workshop® code generation system and the Simulink HDL Coder system from The MathWorks, Inc., the DSP Builder product from Altera Corp. of San Jose, Calif., and the System Generator product from Xilinx, Inc. of San Jose, Calif. Additional code generation systems are described in U.S. Patent Publication No. 2008/0127057 for Specifying Implementations of Code for Code Generation from a Model, published May 29, 2008, and U.S. Patent Publication No. 2006/0064669 for Automatic Generation of Code for Component Interfaces in Models, published Mar. 23, 2006, each of which is hereby incorporated by reference in its entirety.

The code generation engine 1033 generates code for the received verification model or verification files utilizing the user-specified options, as indicated at block 1706. To the extent the code generation engine 1033 generates source code conforming to a high-level programming language, the source code may be compiled into object code, as indicated at block 1708. To the extent the code generation engine 1033 generates HDL code, the generated HDL code may be used to synthesize a target hardware device, as indicated at block 1710. More specifically, the HDL code may be provided to a synthesis tool and synthesized into a gate-level netlist, which may be used to create a layout for creating or configuring a physical hardware device, such as an Application Specific Integrated Circuit (ASIC), a Field Programmable Gate Array (FPGA), a Programmable Array Logic (PAL), or other type of physical hardware devices.

The generated code may be subjected to testing, such as hardware-in-the-loop (HIL) testing, as indicated at block 1712. That is, a target platform configured to run the generated code may be connected to the computing device 1000. A graphical model simulated by the graphical modeling environment 1006 may interoperate with the generated code running on the target platform. The graphical model may provide input data to the target platform and may receive output data, e.g., for display, produced by the target platform.

Suitable systems for performing HIL testing including the xPC Target system from The MathWorks, Inc. With the xPC Target system, a target personal computer (PC), which operates as a real-time target, is connected to a host PC that is running a text-based computing environment and/or a graphical modeling environment.

It should be understood that the code generation process may be used to accelerate verification of a model based design.

Following the testing, if any, the generated code may be deployed in a finished, real-life component that operates wholly outside and independently of the confines of the text-based computing environment 1002 or the graphical modeling environment 1006, as indicated at block 1714.

It should be understood that other forms of target code execution, such as Rapid Prototyping, Embedded System Deployment, and Processor-in-the-Loop, which execute a graphical model or portions of a model via the generated code on a real-time system target, may be utilized.

Figure 18:
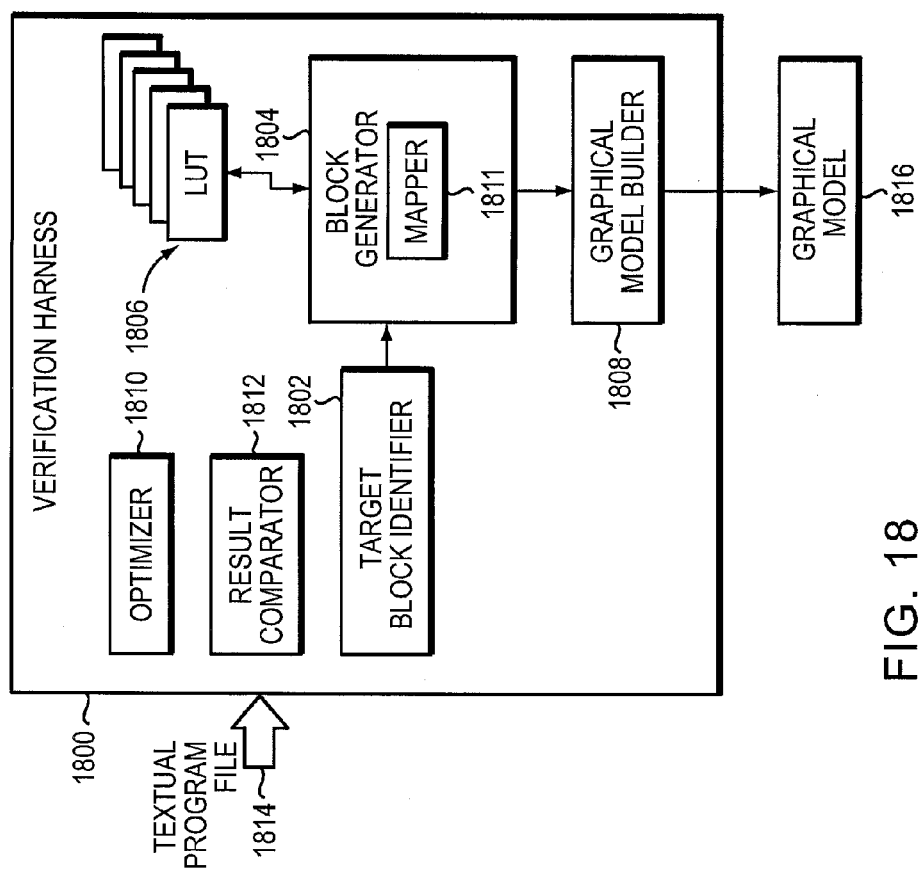
FIG. 18 is a schematic illustration of a verification harness in accordance with an embodiment of the present invention.

FIG. 18 is a schematic illustration of a verification harness 1800 in accordance with yet another embodiment of the present invention. The verification harness 1800 may include a system object identifier 1802, a block generator 1804, a plurality of look-up tables (LUTs) 1806, a graphical model builder 1808, an optimizer 1801, and a result comparator 1812. The block generator 1804 may include a mapper 1811. As described herein, the verification harness 1800 may receive an object-oriented, textual program file, as indicated by arrow 1814. The textual program file contains one or more commands or methods that instantiate a system object, set the object's properties and run the system object. The verification harness 1800 may select an executable, graphical block for each instantiated system object, set the block's parameters and assemble the selected blocks into a graphical model 1816 that, when run, performs the same function or procedure as the received object-oriented, textual program file.

The verification harness 1800 may be implemented in a computing device, such as device 1000 (FIG. 10), and may be coupled to a text-based computing environment and a graphical modeling environment.

Figure 18A:
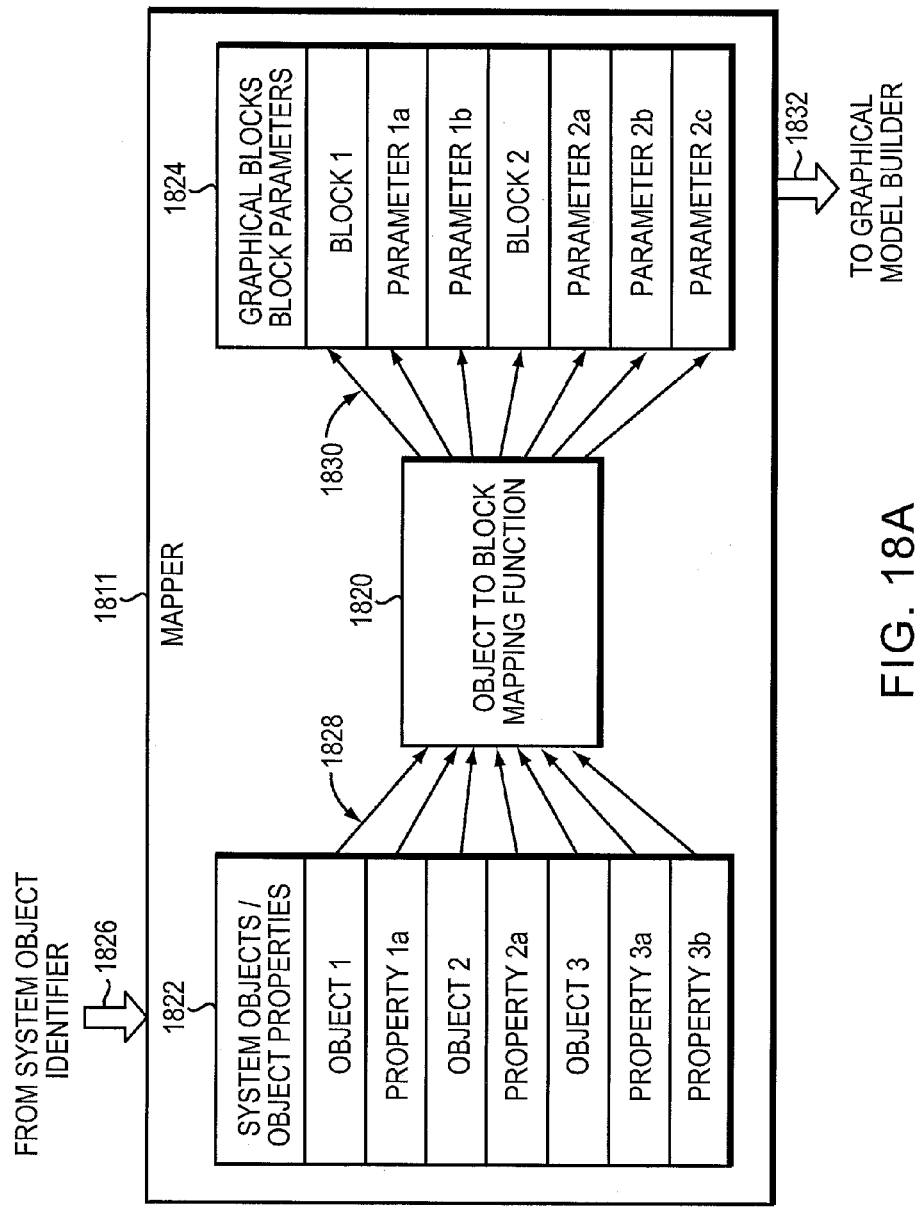
FIG. 18A is a schematic illustration of a mapping function in accordance with an embodiment of the present invention.

FIG. 18A is a schematic illustration of an embodiment of the mapper 1811. The mapper 1811 may include a mapping function 1820, executable by a processor, that maps system objects and object properties to graphical blocks and block parameters in a predetermined manner. Illustratively, a first list 1822 or other data structure contains information on the system objects and their respective object properties, and is connected to the mapping function 1820. A second list 1824 or other data structure contains information on the graphical blocks and their respective block parameters, and is also connected to the mapping function 1820. As indicated by arrow 1826, the mapper 1811 receives information from the system object identifier 1802, such as the types of system objects in the received textual program file and their properties. As illustrated by arrows 1828 and 1830, the mapping function 1820 implements a predetermined association of system objects and object properties with corresponding graphical blocks and block parameters. The mapping function 1820 may provide a one-to-many or a many-to-many mapping between system objects and object properties, and graphical blocks and block parameters. The graphical blocks and block parameters that are determined by the mapping function 1820 to correspond to the identified system objects and object properties may be provided to the graphical model builder 1808, as indicated by arrow 1832.

Figure 19:
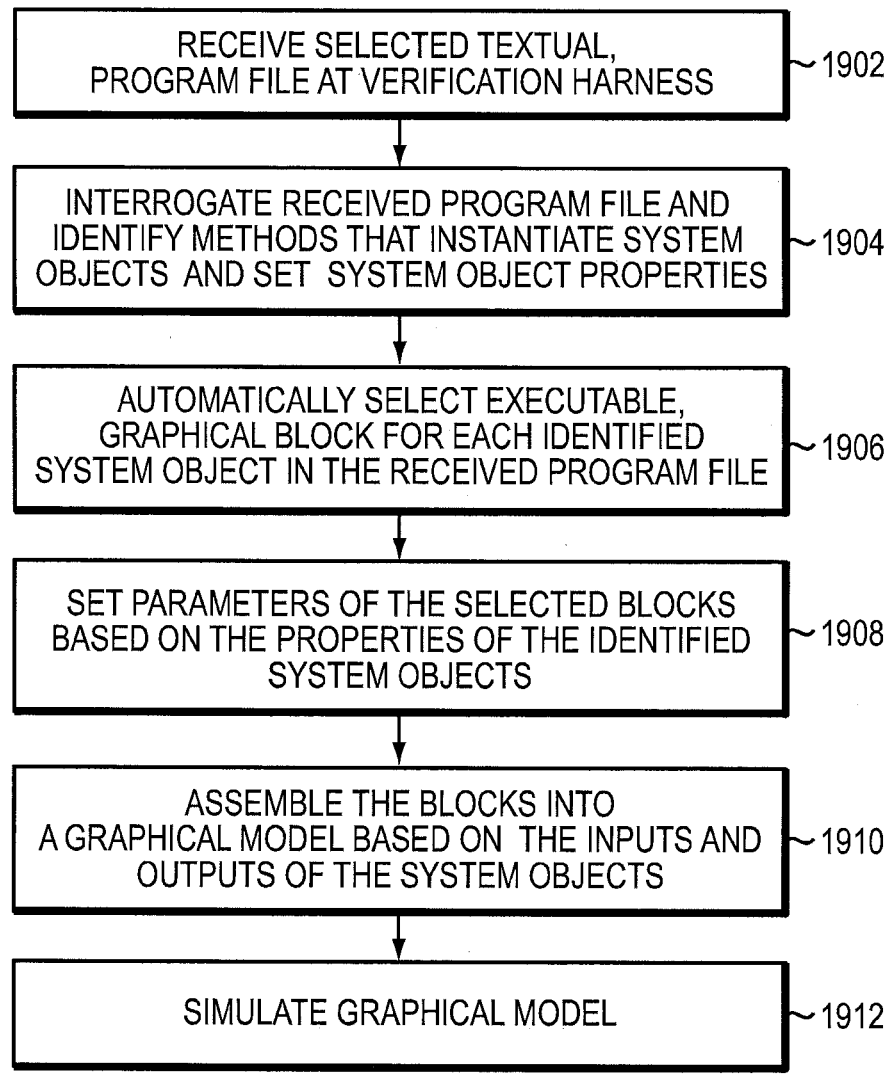
FIG. 19 is a flow diagram of an exemplary method in accordance with an embodiment of the present invention.

FIG. 19 is a flow diagram of a method in accordance with an embodiment of the present invention. A user preferably selects an object-oriented, textual program file, and inputs it into the verification harness 1800, as indicated at block 1902. The system object identifier 1802 may step through the textual program file and identify each command or method that instantiates a system object, sets the object's properties and runs the object, as indicated at block 1904. The system object identifier 1802 may provide this information to the block generator 1804. For each command or method that instantiates a system object and sets its properties, the mapper 1811 of the block generator 1804 may access the LUTs 1806 to determine which particular graphical block should be selected for the subject system object, as indicated at block 1906. The block generator 1804 may also utilize the LUTs 1806 to generate the parameters of the selected graphical block based on the properties of the system object that is being represented by the graphical block, as indicated at block 1908. The LUTs 1806 of the verification harness 1800 may operate in a similar manner as the LUTs 1020 of the verification harness 1004, except in a reverse direction. That is, LUTs 1806 map system object properties to graphical block parameters.

The block generator 1804 may pass the selected and configured graphical blocks to the graphical model builder 1808. The graphical model builder 1808 may examine the input and output data of the system objects of the textual program file. The graphical model builder 1808 may then use this information in determining how the executable, graphical blocks are to be interconnected to form the graphical model 1816, as indicated at block 1910. The graphical model 1816 may be output from the verification harness 1800, and may be simulated or run by the simulation engine 1015 (FIG. 10) of the graphical modeling environment 1006, as indicated at block 1912.

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, some of the steps illustrated in the flow diagrams may be performed in other orders and non-dependent steps may be performed in parallel.

In addition, implementations consistent with the principles of the invention may be implemented using devices and configurations other than those illustrated in the figures and described in the specification without departing from the spirit and scope of the invention. As mentioned, devices, modules or components may be added, removed or combined depending on a specific deployment or application of the invention. Further disclosed implementations may not be limited to any specific combination of hardware.

What is claimed is:

1. A method comprising:
for an object-oriented, text-based computer program having a plurality of commands that instantiate objects, where the instantiated objects have one or more object properties, and a plurality of the instantiated objects interact with one another to implement a procedure;
creating, by a processor, a graphical model including executable graphical blocks having functionality equivalent to functionality of the instantiated objects of the text-based computer program, the executable graphical blocks
having one or more graphical block parameters, and being interconnected so as to implement the procedure;
assigning values to the one or more graphical block parameters of the executable graphical blocks of the graphical model based on the one or more object properties of the instantiated objects of the text-based computer program;
executing, by the processor, the graphical model to produce at least one graphical is model output;
executing, by the processor, the text-based computer program to produce at least one program output; and
comparing the at least one graphical model output with the at least one program output to determine whether the graphical model simulates operation of the text-based computer program.

2. The method of claim 1 further comprising:
organizing at least some of the executable graphical blocks into a subsystem or a submodel of the graphical model.

3. The method of claim 1 wherein the text-based computer program has a hierarchical structure, the creating including:
organizing a group of the executable graphical blocks in a subsystem or a submodel of the graphical model based on the hierarchical structure of the text-based computer program.

4. The method of claim 1 wherein:
one or more of the instantiated objects map to one or more of the executable graphical blocks in a one to one relationship, a one to many relationship, a many to one relationship, or a many to many relationship.

5. The method of claim 1 further comprising:
comparing a block output of the graphical model with an intermediate output of the object-oriented, text-based computer program.

6. The method of claim 1 further comprising:
comparing a subsystem output of the graphical model with an intermediate output of the object-oriented, text-based computer program.

7. The method of claim 1 further comprising:
identifying, for the instantiated objects of the text-based computer program, the executable graphical blocks having functionality equivalent to functionality of the instantiated objects.

8. A method comprising:
for an object-oriented, text-based computer program configured to instantiate objects, the instantiated objects having object properties, and
interacting with one another to implement a procedure;
organizing model entities having parameters and functionality equivalent to functionality of the instantiated objects, using a processor, so as to implement the procedure of the object-oriented, text-based computer program;
assigning values to the parameters of the model entities based on the object properties of the instantiated objects;
executing, by the processor, the model entities to produce a first output;
executing, by the processor, the object-oriented, text-based computer program to produce a second output; and
comparing the first output to the second output.

9. The method of claim 8 wherein the organizing includes:
arranging the model entities to form a graphical model, a subsystem, or a submodel.

10. The method of claim 8 wherein at least some of the model entities are blocks, and the organizing includes arranging the blocks to form a block diagram model.

11. The method of claim 8 wherein at least one of the model entities is a block, and the first output is produced by the block, at least one of the model entities is a subsystem, and the first output is produced by the subsystem, or at least one of the model entities is a submodel, and the first output is produced by the submodel.

12. The method of claim 8 further comprising:
automatically identifying, by the processor, the model entities having the parameters and functionality equivalent to functionality of the instantiated objects.

13. One or more non-transitory computer-readable media comprising program instructions executable by a processor, the non-transitory computer-readable media comprising:
for an object-oriented, text-based computer program configured to instantiate objects, where the instantiated objects have object properties, and a plurality of the instantiated objects interact with one another to implement a procedure;
instructions to create a graphical model including executable graphical blocks having functionality equivalent to functionality of the instantiated objects of the text-based computer program, the executable graphical blocks having graphical block parameters, and being interconnected so as to implement the procedure;
instructions to assign values to the graphical block parameters of the executable graphical blocks of the graphical model based on the object properties of the instantiated objects of the text-based computer program;
instructions to execute the graphical model to produce at least one graphical model output;
instructions to execute the text-based computer program to produce at least one program output; and
instructions to compare the at least one graphical model output with the at least one program output.

14. The one or more non-transitory computer-readable media of claim 13 further comprising:
instructions to organize at least some of the executable graphical blocks into a subsystem or a submodel of the graphical model.

15. The one or more non-transitory computer-readable media of claim 13 wherein the text-based computer program has a hierarchical structure, the instructions to create including:
instructions to organize a group of the executable graphical blocks in a subsystem or a submodel of the graphical model based on the hierarchical structure of the text-based computer program.

16. The one or more non-transitory computer-readable media of claim 13 wherein:
one or more of the instantiated objects map to one or more of the executable graphical blocks in a one to one relationship, a one to many relationship, a many to one relationship, or a many to many relationship.

17. The one or more non-transitory computer-readable media of claim 13 further comprising:
instructions to compare a block output of the graphical model with an intermediate output of the object-oriented, text-based computer program.

18. The one or more non-transitory computer-readable media of claim 13 further comprising:
instructions to compare a subsystem output of the graphical model with an intermediate output of the object-oriented, text-based computer program.

19. The one or more non-transitory computer-readable media of claim 11 further comprising:
instructions to identify, for the instantiated objects of the text-based computer program, the executable graphical blocks having functionality equivalent to the instantiated objects.

20. An apparatus comprising:
for an object-oriented, text-based computer program configured to instantiate objects, where the instantiated objects have object properties, and a plurality of the instantiated objects interact with one another to implement a procedure;
a processor configured to:
create a graphical model including executable graphical blocks having functionality equivalent to functionality of the instantiated objects of the text-based computer program, the executable graphical blocks having graphical block parameters, and being interconnected so as to implement the procedure;
assign values to the graphical block parameters of the executable graphical blocks of the graphical model based on the object properties of the instantiated
execute the graphical model to produce at least one graphical model output;
execute the text-based computer program to produce at least program output; and
compare the at least one graphical model output with the at least one program output.

21. The apparatus of claim 20 wherein the processor is further configured to:
organize at least some of the executable graphical blocks into a subsystem or a submodel of the graphical model.

22. The apparatus of claim 20 wherein the text-based computer program has a hierarchical structure, the processor further configured to:
organize a group of the executable graphical blocks in a subsystem or a submodel of the graphical model based on the hierarchical structure of the text-based computer s program.

23. The apparatus of claim 20 wherein:
one or more of the instantiated objects map to one or more of the executable graphical blocks in a one to one relationship, s a one to many relationship, a many to one relationship, or a many to many relationship.

24. The apparatus of claim 20 wherein the processor is further configured to:
compare a block output of the graphical model with an intermediate output of the object-oriented, text-based computer program.

25. The apparatus of claim 20 wherein the processor is further configured to:
compare a subsystem output of the graphical model with an intermediate output of the object-oriented, text-based computer program.

26. The apparatus of claim 17 wherein the processor is further configured to:
identify, for the instantiated objects of the text-based computer program, the executable graphical blocks having functionality equivalent to functionality of the instantiated objects.

* * * * *

UNITED STATES PATENT AND TRADEMARK OFFICE
CERTIFICATE OF CORRECTION

PATENT NO. : 9,880,922 B1
APPLICATION NO. : 14/511359
DATED : January 30, 2018
INVENTOR(S) : David Koh et al.

It is certified that error appears in the above-identified patent and that said Letters Patent is hereby corrected as shown below:

In the Claims

Claim 1, Column 29, Line 7 reads:
"duce at least one graphical is model output;"
Should read:
--duce at least one graphical model output;--

Claim 19, Column 32, Line 2 reads:
"media of claim 11 further comprising:"
Should read:
--media of claim 13 further comprising:--

Claim 20, Column 32, Line 23 reads:
"based on the object properties of the instantiated"
Should read:
--based on the object properties of the instantiated objects of the text based computer program;--

Claim 22, Column 32, Line 41 reads:
"s program."
Should read:
--program.--

Claim 23, Column 32, Line 45 reads:
"relationship, s a one to many relationship, a many to"
Should read:
--relationship, a one to many relationship, a many to--

Signed and Sealed this
Fourteenth Day of May, 2019

Andrei Iancu
*Director of the United States Patent and Trademark Office*

CERTIFICATE OF CORRECTION (continued)
U.S. Pat. No. 9,880,922 B1

Claim 26, Column 32, Line 57 reads:
"26. The apparatus of claim 17 wherein the processor is"
Should read:
--26. The apparatus of claim 20 wherein the processor is--